(12) United States Patent
Wang

(10) Patent No.: US 7,776,621 B2
(45) Date of Patent: Aug. 17, 2010

(54) SEMICONDUCTOR DEVICE AND MANUFACTURING METHOD THEREOF

(75) Inventor: Wensheng Wang, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/657,549

(22) Filed: Jan. 25, 2007

(65) Prior Publication Data

US 2008/0064124 A1 Mar. 13, 2008

(30) Foreign Application Priority Data

Sep. 12, 2006 (JP) .............................. 2006-247110

(51) Int. Cl.
*H01L 21/00* (2006.01)
(52) U.S. Cl. .................... 438/3; 438/381; 438/239; 257/295; 257/E27.048; 257/E27.104
(58) Field of Classification Search ................ 438/3, 438/239, 381; 257/295, E27.048, E27.104
See application file for complete search history.

(56) References Cited

U.S. PATENT DOCUMENTS

| 6,169,305 | B1 | 1/2001 | Takai et al. | |
|---|---|---|---|---|
| 6,194,228 | B1 | 2/2001 | Fujiki et al. | |
| 6,624,458 | B2* | 9/2003 | Takamatsu et al. | 257/295 |
| 6,740,533 | B2 | 5/2004 | Takamatsu et al. | |
| 2002/0072223 | A1* | 6/2002 | Gilbert et al. | 438/629 |
| 2002/0185668 | A1 | 12/2002 | Takamatsu et al. | |
| 2003/0213986 | A1 | 11/2003 | Takamatsu et al. | |
| 2005/0128663 | A1* | 6/2005 | Yamazaki et al. | 361/56 |

FOREIGN PATENT DOCUMENTS

| JP | 10-242078 A | 9/1998 |
|---|---|---|
| JP | 2000-173999 A | 6/2000 |

OTHER PUBLICATIONS

Kumura et al. "A SrRuO3/IrO2 top electrode FeRAM with Cu BEOL process for embedded memory of 130 nm generation and beyond," Solid-State Electronics 50, 2006, pp. 606-612.*

* cited by examiner

*Primary Examiner*—Asok K Sarkar
*Assistant Examiner*—Julia Slutsker
(74) *Attorney, Agent, or Firm*—Westerman, Hattori, Daniels & Adrian, LLP

(57) ABSTRACT

An $IrO_X$ film of a thickness of 50 nm is formed on a PZT film by a sputtering method. The value of x is less than 2. Namely, an unsaturated iridium oxide film is formed. By performing RTA, the PZT film is completely crystallized. Thereafter, an $IrO_Y$ film of a thickness of 50 nm to 100 nm is formed on the $IrO_X$ film by a sputtering method. The composition of $IrO_Y$ is made a composition closer to the stoichiometric composition of $IrO_2$ than the composition of $IrO_X$ ($X<Y \leq 2$). This is because by adopting such a composition, the catalytic action to hydrogen is suppressed, the problem of the PZT film being reduced by hydrogen radicals is suppressed and hydrogen endurance of the ferroelectric capacitor is enhanced. An $Sr_XRu_YO_3$ film in an amorphous state with a thickness of about 20 nm is formed on $IrO_Y$ film by a sputtering method.

18 Claims, 16 Drawing Sheets

SEMICONDUCTOR DEVICE AND MANUFACTURING METHOD THEREOF

CROSS-REFERENCE TO RELATED APPLICATIONS

This application is based upon and claims the benefit of priority from the prior Japanese Patent Application No. 2006-247110, filed on Sep. 12, 2006, the entire contents of which are incorporated herein by reference.

BACKGROUND OF THE INVENTION

1. Field of the Invention

The present invention relates to a semiconductor device preferable for a ferroelectric memory, and a manufacturing method thereof.

2. Description of the Related Art

In recent years, with development of the digital technology, there has been a growing trend to process or store a large capacity of data at a high speed. Therefore, high integration density and high performance of the semiconductor devices used for electronic equipment are required.

Thus, concerning a semiconductor device, in order to realize, for example, high integration density of a DRAM, the technique using a ferroelectric material or a high dielectric constant material in place of the conventional silicon oxide or silicon nitride as a capacity insulating film of a capacitor element composing a DRAM starts to be researched and developed on a wide scale.

In order to realize a nonvolatile RAM capable of write operation and read operation at a lower voltage and a higher speed, the technique of using a ferroelectric film having spontaneous polarization characteristics as a capacity insulating film has been increasingly researched and developed. Such a semiconductor memory device is called a ferroelectric memory (FeRAM).

A ferroelectric memory stores information by using a hysteresis characteristic of a ferroelectric. The ferroelectric memory includes a ferroelectric capacitor, and the ferroelectric capacitor is constructed by sandwiching a ferroelectric film as a capacitor dielectric film between a pair of electrodes. The ferroelectric film causes polarization in accordance with an applied voltage between the electrodes, and has spontaneous polarization even after the applied voltage is removed. If the polarity of the applied voltage is inversed, the polarity of the spontaneous polarization is inversed. Accordingly, if the spontaneous polarization is detected, information can be read. The ferroelectric memory operates at a lower voltage as compared with a flash memory, and is capable of writing at a high speed with power-saving.

Now, use of a logic-mounted chip (SoC: System on Chip) including a ferroelectric memory for an IC card or the like is studied.

As a ferroelectric film, a film of a PZT material, a film of a Bi-layer structure compound, and the like are used. As the PZT material, lead zirconate titanate (PZT) itself, a PZT film doped with La, Ca, Sr and/or Si, and the like are cited. As the Bi-layer structure compound, $SrBi_2Ta_2O_9$ (SBT, Y1), and $SrBi_2(Ta,Nb)_2O_9$ (SBTN, YZ), and the like are cited. The ferroelectric film is formed in an amorphous state or a microcrystal state on the bottom electrode film by a sol-gel method, a sputtering method or the like, and thereafter, is crystallized by heat treatment. It is sometimes formed in a crystallized state on the bottom electrode by an MOCVD (Metal Organic Chemical Vapor Deposition) method.

In recent years, the ferroelectric memory has been applied to portable information processing equipment such as a cellular phone. Therefore, operation at a low voltage is required of a ferroelectric memory. Thus, a large switching charge amount is required. However, a ferroelectric film has the property that oxygen deficiency easily occurs due to processing under a non-oxidizing atmosphere and the characteristics of a switching charge amount (inversion charge amount), a leak current value and the like easily degrade. On the occasion of forming a ferroelectric capacitor, oxygen deficiency, damages and the like easily occur to the ferroelectric film. Therefore, in order to recover them, heat treatment (recovery annealing) under an oxygen atmosphere is performed a plurality of times. Thus, as the material of the top electrode, a metal such as Pt, which is hardly oxidized under an oxygen atmosphere, and a conductive oxide such as $IrO_X$ and $RuO_X$ is used.

On the other hand, microfabrication is also required of a ferroelectric memory, and a multilayer wiring structure is being adopted. However, in the case of adopting the multilayer wiring structure, the processing under a reducing atmosphere or a non-oxidizing atmosphere is required. For example, when the multilayer wiring structure is adopted, an interlayer insulating film is sometimes formed under a reducing atmosphere including hydrogen. Accordingly, even when recovery annealing is performed in forming a ferroelectric capacitor, the characteristics of the ferroelectric film sometimes degrade thereafter. This is especially conspicuous when Pt or Ir is used as the material of the top electrode. This is because Pt has catalysis, hydrogen which diffuses into the top electrode including Pt is activated, and by this effect, the ferroelectric film is reduced. If the ferroelectric is reduced, the characteristics of the ferroelectric capacitor significantly degrade. Such degradation of the characteristics becomes conspicuous as the ferroelectric capacitor is microfabricated, and the capacitor insulating film in the ferroelectric capacitor is microfabricated.

Thus, adoption of a conductive oxide is conceivable, but another problem occurs though reduction can be suppressed in the conductive oxide conventionally used. In a stack type ferroelectric capacitor, a contact plug is formed on the top electrode, and its base film (a Ti film, a TiN film and/or the like) is oxidized by the influence of oxygen included in the conductive oxide. Occurrence of such oxidization increases contact resistance between the top electrode and the contact plug.

As described above, in the related art, the problem of reduction of the ferroelectric film occurs in the case of using Pt or the like for the top electrode, and the problem of rise of the contact resistance occurs in the case of using a conductive oxide. These problems are not solved in the arts disclosed in Japanese Patent Application Laid-open No. 11-195768, Japanese Patent No. 3661850, Japanese Patent Application Laid-open No. 2000-91539, Japanese Patent Application Laid-open No. 2000-173999, Japanese Patent No. 3299909 and Japanese Patent Application Laid-open No. 2005-93605.

SUMMARY OF THE INVENTION

The present invention has an object to provide a semiconductor device capable of obtaining high reliability while securing favorable characteristics, and a manufacturing method thereof.

The inventor of the present application verified the art disclosed in Japanese Patent No. 3661850, and found out that when a crystallized second conductive oxide film with a higher oxidation degree, which was formed on a first conductive oxide film with a lower oxidation degree, was made thick, crystal grew abnormally easily on its surface. Especially when it was formed at a high temperature, when the thickness was made 150 nm or more, abnormal growth was conspicuous as shown in FIG. 5. FIG. 5 is a microphotograph showing abnormal growth which occurred in the second conductive oxide film.

Thus, on formation of the second conductive oxide film, after the conductive oxide film in the amorphous state was formed at a low temperature, the conductive oxide film was continuously formed while the power was changed and the substrate temperature was raised, whereby abnormal oxidation was able to be prevented. The lowermost portion of such a second conductive oxide film was in an amorphous state, and the uppermost portion was crystallized. The oxidation degree of the uppermost portion was lower than that of the lowermost portion.

However, though the abnormal oxidation can be prevented, the problem of oxidation of the glue film remains as described above. When a W plug is formed as the contact plug, it is necessary to form the W film under a reducing atmosphere including hydrogen at a high temperature. Since the glue film (TiN film) exists at this time, hydrogen cannot diffuse to the second conductive oxide film, but when hydrogen is excessively supplied, hydrogen sometimes reaches the second conductive oxide film. As a result, the second conductive oxide film (for example, an $IrO_X$ film) is reduced, volume shrinkage occurs to it, and voids are formed between the glue film and the second conductive oxide film. For this reason, the contact resistance sometimes rises.

In order to reduce the contact resistance, it is suitable to form a noble metal film such as an Ir film on the second conductive oxide film, but as described above, its catalysis sometimes degrades the ferroelectric film. Further, the second conductive oxide film is sometimes reduced by the catalysis of the noble metal film. Therefore, the switching charge amount of the ferroelectric capacitor becomes lower after formation of the multilayer wiring than before formation of it. Namely, in-process degradation occurs.

The inventor of the present application made observation using a transmission electron microscope (TEM), and found out that, when the in-process degradation as described above occurred, a number of voids generated in the second conductive oxide film ($IrO_2$ film) as shown in FIG. 6. As the cause of occurrence of the voids, the following is conceivable. First, since it is heated on the occasion of formation of wiring, the interlayer insulating film and the like, the amorphous portion in the second conductive oxide film is crystallized, and at this time, oxygen deficiency or the like occurs, thus causing the voids. Secondarily, the second conductive oxide film is reduced by the catalysis of the noble metal film, and the voids occur.

Thus, it is conceivable that due to existence of the voids, hydrogen easily enters, and peeling easily occurs. Therefore, it is conceivable that if occurrence of the voids can be suppressed, the characteristics can be improved.

Thus, as a result of repeating earnest studies based on the above knowledge, the inventor of the present application has reached the modes of the invention which are shown as follows.

In a semiconductor device according to the invention of the present application, a bottom electrode formed above a substrate, a ferroelectric film formed on the bottom electrode, and a top electrode formed on the ferroelectric film are provided. In the top electrode, a first conductive noble metal oxide film formed on the ferroelectric film, a second conductive noble metal oxide film formed on the first conductive noble metal oxide film, and a conductive metal compound film formed on the second conductive noble metal film are provided. The second conductive noble metal oxide film is higher in oxidation degree than the first conductive noble metal oxide film.

In a method for manufacturing a semiconductor device according to the invention of the present application, a bottom electrode is formed above a substrate, and thereafter, a ferroelectric film is formed on the bottom electrode. Next, a top electrode is formed on the ferroelectric film. On forming the top electrode, a first conductive noble metal oxide film is formed on the ferroelectric film, and thereafter, a second conductive noble metal oxide film higher in oxidation degree than the first conductive noble metal oxide film is formed on the first conductive noble metal oxide film. Subsequently, a conductive metal compound film is formed on the second conductive noble metal film.

DETAILED DESCRIPTION OF THE PREFERRED EMBODIMENTS

Embodiments of the present invention will now be described concretely with reference to the attached drawings. It should be noted that the sectional structure of each memory cell of a ferroelectric memory will be described with its manufacturing method here for convenience.

First Embodiment

Figure 1A:
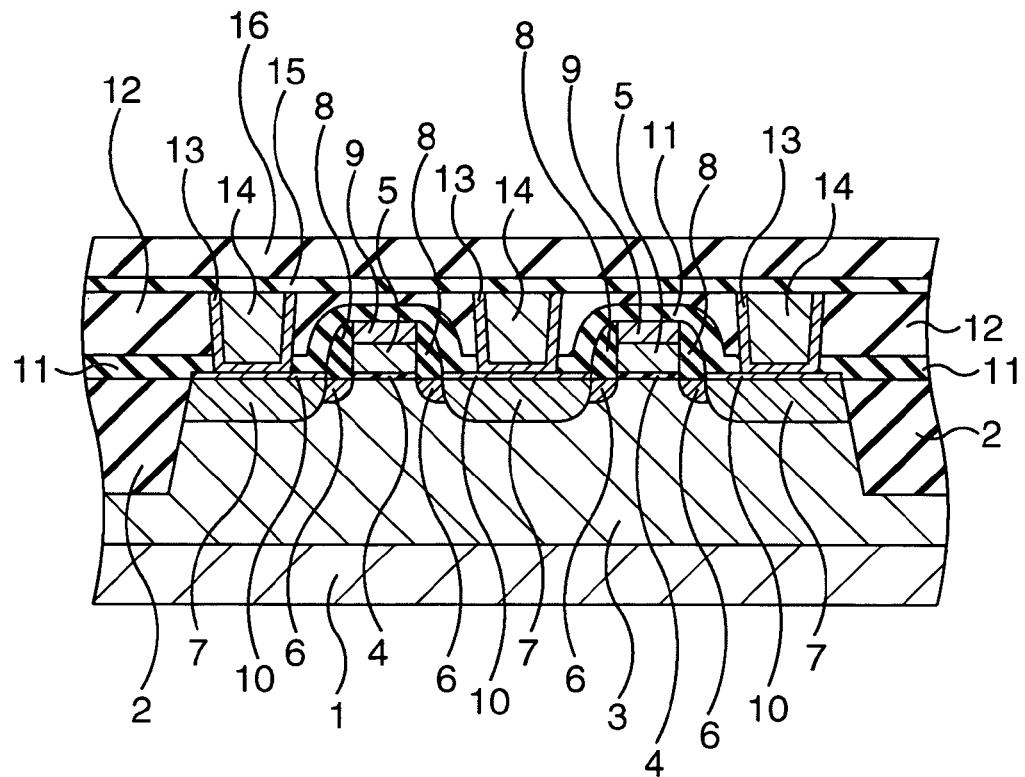
FIGS. 1A to 1Q are sectional views showing a manufacturing method of a ferroelectric memory according to a first embodiment of the present invention in sequence of process steps.

A first embodiment of the present invention will be first described. FIGS. 1A to 1Q are sectional views showing a manufacturing method of a ferroelectric memory (semiconductor device) according to the first embodiment of the present invention in sequence of the process steps.

In the first embodiment, first, as shown in FIG. 1A, a trench for STI (Shallow Trench Isolation) which defines an active region of a transistor is formed on a surface of an n-type or a p-type silicon substrate 1, and by burying an insulation film of silicon oxide or the like therein, an element isolating insulating film 2 is formed. The element isolation insulating film may be formed by an LOCOS (Local Oxidation of Silicon) method.

Next, by introducing a p-type impurity into the active region, a p-well 3 is formed. Next, by thermally oxidizing the surface of the active region, a gate insulating film 4 is formed. Subsequently, an amorphous or polycrystalline silicon film is formed on an entire surface over the silicon substrate 1, and by patterning this by a photolithography technique, a gate electrode 5 is formed. At this time, two gate electrodes 5 are disposed on the p-well 3 to be parallel with each other. These gate electrodes 5 function as part of a word line of a memory.

Next, introduction (ion implantation) of an n-type impurity is performed by using the gate electrodes 5 as a mask, and thereby, extension layers 6 are formed at both sides of the gate electrodes 5. Thereafter, an insulating film is formed on the entire surface over the silicon substrate 1, and by etching it back, insulating side walls 8 are formed at the sides of the gate electrodes 5. As the insulating film, for example, a silicon oxide film is formed by a CVD method.

Subsequently, by performing introduction (ion implantation) of an n-type impurity by using the side walls 8 and the gate electrodes 5 as a mask, impurity diffusion layers 7 are formed at both sides of the gate electrodes 5. Two sets of the extension layers 6 and the impurity diffusion layers 7 constitute a source and a drain of an MOS transistor.

Next, a refractory metal layer such as a cobalt layer is formed on the entire surface over the silicon substrate 1 by a sputtering method, and the refractory metal layer is heated to be reacted with silicon. As a result, a silicide layer 9 of a refractory metal is formed on the gate electrode 5, and a silicide layer 10 of a refractory metal is formed on the impurity diffusion layer 7. The unreacted refractory metal layer on the element isolation insulating film 2 and the like is removed by wet etching.

Next, a silicon oxynitride film 11 of a thickness of about 200 nm is formed on the entire surface over the silicon substrate 1 by a plasma CVD method, for example. Next, a silicon oxide film 12 of a thickness of about 1000 nm is formed on the silicon oxynitride film 11 by a plasma CVD method using a TEOS gas as a source gas, for example. Thereafter, a top surface of the silicon oxide film 12 is polished and flattened by a CMP (Chemical Mechanical Polishing) method. In the flattening, the thickness of the silicon oxide film 12 is made about 700 nm from the top surface of the silicon substrate 1.

Next, by patterning the silicon oxide film 12 and the silicon oxynitride film 11 by a photolithography technique, contact holes in which the silicide layers 10 are exposed are formed. The diameter of the contact hole is made, for example, 0.25 μm. Next, by sequentially forming a Ti film of a thickness of about 30 nm and a TiN film of a thickness of about 20 nm on bottom portions and side portions of the contact holes, a glue film (adhesive film) 13 is formed. Thereafter, a tungsten film (W film) 14 is formed in the contact holes and on the silicon oxide film 12. The thickness of the W film 14 is made about 300 nm from the top surface of the silicon oxide film 12. Subsequently, by performing CMP, the glue film 13 and the W film 14 are left only in the contact holes. Contact plugs are constituted of them. In the CMP, by performing over polishing, the glue film 13 and the W film 14 on the silicon oxide film 12 are completely removed.

Next, a silicon oxynitride film 15 of a thickness of about 130 nm is formed on the silicon oxide film 12 and the contact plugs as an oxidation prevention film by a plasma CVD method, for example. Further, on the silicon oxynitride film 15, a silicon oxide film 16 of a thickness of about 300 nm is formed by a plasma CVD method using a TEOS gas as a source gas, for example. As the oxidation preventing film, instead of the silicon oxynitride film 15, a silicon nitride film or an aluminum oxide film may be formed.

Figure 1B:
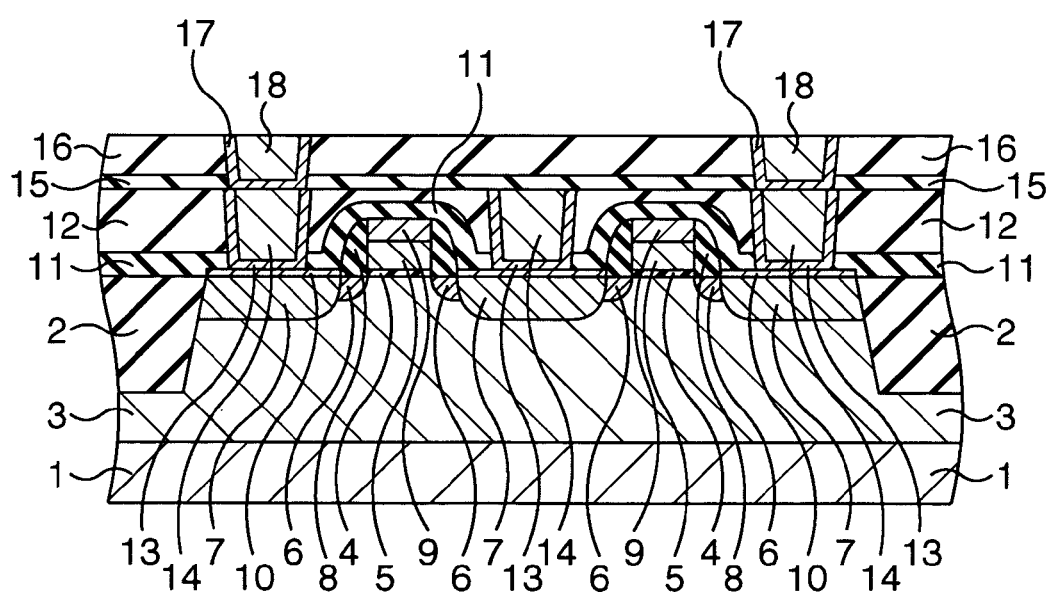

Next, as shown in FIG. 1B, by patterning the silicon oxide film 16 and the silicon oxynitride film 15 by a photolithography technique, contact holes in which the silicide layers 10 are exposed are formed. The diameter of the contact hole is, for example, 0.25 μm. Next, a Ti film of a thickness of about 30 nm and a TiN film of a thickness of about 20 nm are sequentially formed on the bottom portions and side portions of the contact holes, and thereby, a glue film (adhesive film) 17 is formed. Thereafter, tungsten films (W film) 18 are formed in the contact holes and on the silicon oxide film 16. The thickness of the W film 18 is about 300 nm from the top surface of the silicon oxide film 16. Subsequently, by performing CMP, the glue film 17 and the W film 18 are left in only the contact holes. Contact plugs are constituted of them. In the CMP, by performing over polishing, the glue film 17 and the W film 18 on the silicon oxide film 16 are completely removed.

Next, by performing $NH_3$ plasma processing for the surface of the silicon oxide film 16, NH groups are bonded to oxygen atoms on the surface of the silicon oxide film 16. In this plasma processing, for example, a parallel plate type plasma processing apparatus provided with opposed electrodes at a position separated by about 9 mm (350 mils) from the silicon substrate 1 is used. In the state in which the set temperature of the silicon substrate 1 is made 400° C., and the pressure in the chamber is set at 266 Pa (2 Torr), an ammonia gas is supplied into the chamber at a flow rate of 350 sccm. A radiofrequency of 13.56 MHz is supplied to the silicon substrate 1 side with power of 100 W, and a radiofrequency of 350 kHz is supplied to the opposed electrodes with power of 55 W. These are continued for 60 seconds.

Figure 1C:
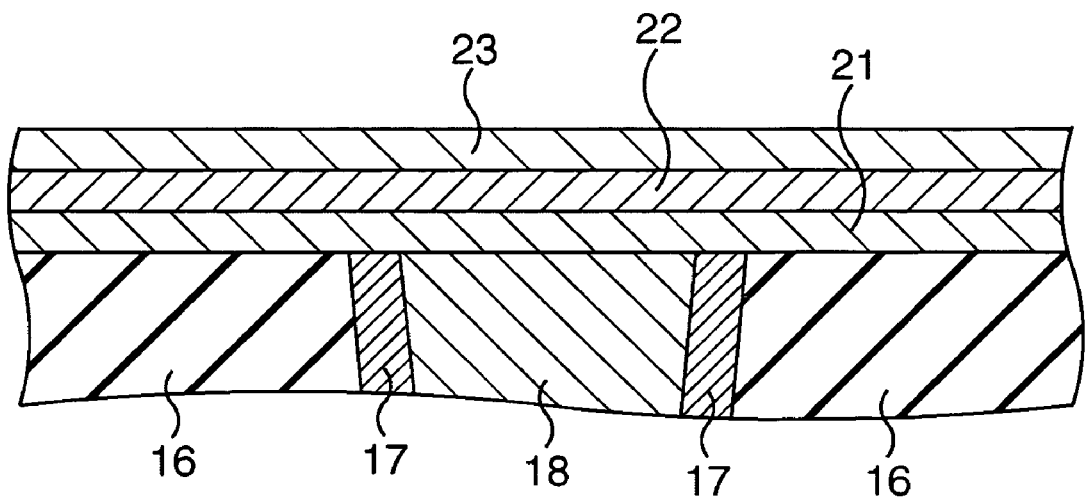

Next, a Ti film of a thickness of about 20 nm is formed on the silicon oxide film 16 and the contact plugs. In formation of the Ti film, for example, a sputtering apparatus provided with a target at the position separated by about 60 mm from the silicon substrate 1 is used. Then, in the state in which the set temperature of the silicon substrate 1 is made 20° C., the pressure in the chamber is set at 0.15 Pa, and the atmosphere in the chamber is made an Ar atmosphere, sputtering DC power of 2.6 kW is supplied for five seconds. In this embodiment, before formation of the Ti film, $NH_3$ plasma processing has been performed for the surface of the silicon oxide film 16. Therefore, Ti atoms deposited thereon are not captured by oxygen atoms, and can freely move on the surface of the silicon oxide film 16. As a result, the Ti film is self-organized, and its surface intensely orients in the (002) plane. Thereafter, by performing RTA (Rapid Thermal Annealing) at 650° C. for 60 seconds under a nitrogen atmosphere, the Ti film is made a TiN film 21 of which surface is intensely oriented in the (111) plane as shown in FIG. 1C.

Subsequently, a TiAlN film 22 of a thickness of about 100 nm is formed on the TiN film 21 as an oxygen diffusion barrier film by a reactive sputtering method, for example. At this time, a target made by alloying Ti and Al, for example, is used. The set temperature of the silicon substrate 1 is made 400° C., the pressure inside the chamber is set at 253.3 Pa, Ar is supplied at a flow rate of 40 sccm and $N_2$ is supplied at a flow rate of 10 sccm. The sputtering power is set at, for example, 1.0 kW.

Next, an Ir film 23 of a thickness of about 100 nm is formed as a noble metal film on the TiAlN 22 by a sputtering method, for example. At this time, the set temperature of the silicon substrate 1 is made 500° C., the pressure in the chamber is set at 0.11 Pa, and the atmosphere in the chamber is made an Ar atmosphere. The sputtering power is set at, for example, 0.5 kW. Instead of the Ir film 23, a film of a metal belonging to a platinum group or a conductive oxide film of it may be formed. Namely, a Pt oxide film, an Ir oxide film or the like may be formed. An SRO film ($SrRuO_3$ film), an LSCO film ($LaSrCoO_3$ film) or the like may be formed. Further, a stacked film of them may be used.

Next, RTA at 650° C. or higher for 60 seconds is performed under an Ar atmosphere. As a result, adhesion among the Ir film 23, the TiAlN film 22 and the TiN film 21 is enhanced, and crystallinity of the Ir film 23 is enhanced.

Figure 1D:
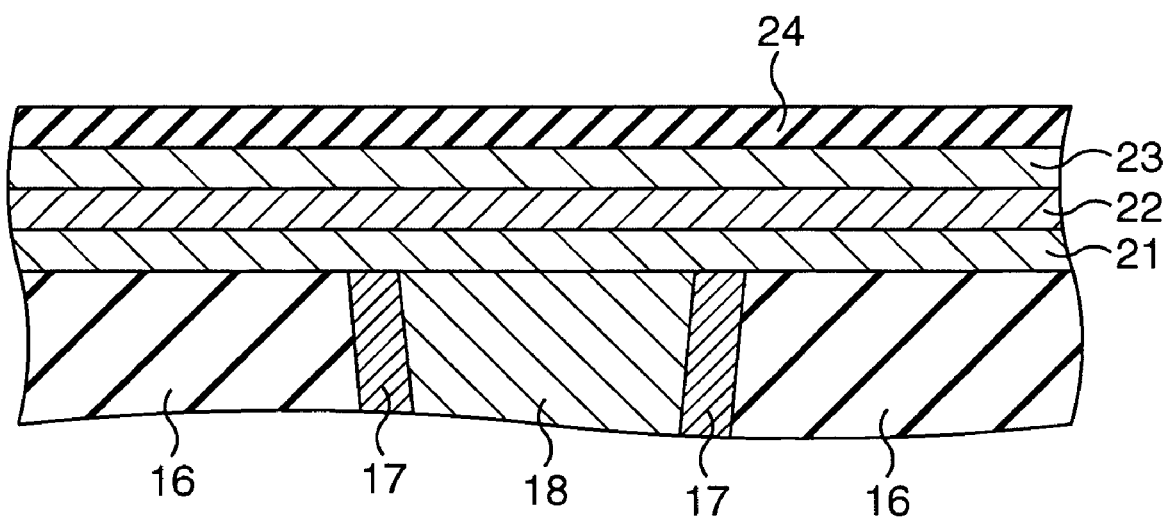

Next, as shown in FIG. 1D, a PZT film 24 of, for example, a two-layer structure is formed.

In formation of the first layer, for example, an MOCVD method is adopted, and its thickness is made about 100 nm. At this time, as a raw material of Pb, $Pb(C_{11}H_{19}O_2)_2$ is used. $Pb(C_{11}H_{19}O_2)_2$ is sometimes expressed as $Pb(DPM)_2$. As a raw material of Zr, $Zr(C_9H_{15}O_2)_4$ is used. $Zr(C_9H_{15}O_2)_4$ is sometimes expressed as $Zr(DMHD)_4$. As a raw material of Ti, $Ti(C_3H_7O)_2(C_{11}H_{19}O_2)_2$ is used. $Ti(C_3H_7O)_2(C_{11}H_{19}O_2)_2$ is sometimes expressed as $Ti(O\text{-}iOr)_2(DPM)_2$. These are dissolved into THF solvents each in concentration of 0.3 mol/litter, and three kinds of liquid raw materials are made. Subsequently, these liquid raw materials are supplied to the vaporizer of an MOCVD apparatus respectively at flow rates of 0.326 ml/min, 0.200 ml/min and 0.200 ml/min together with the THF solvent at a flow rate of 0.474 ml/min, and are vaporized. In this manner, the source gases of Pb, Zr and Ti are obtained.

Further, the pressure inside the MOCVD chamber is set at 665 Pa (5 Torr), the set temperature of the silicon substrate 1 is set at 620° C., and the source gases of Pb, Zr and Ti are supplied into the MOCVD chamber for 620 seconds, for example.

In formation of the second layer a sputtering method is adopted, for example, and its thickness is made 1 nm to 30 nm (for example, 20 nm). In this case, the PZT film of the second layer is in the amorphous state. An MOCVD method may be adopted, and in this case, $Pb(DPM)_2$ is used as a raw material of Pb, $Zr(DMHD)_4$ is used as the raw material of Zr, and $Ti(O\text{-}iOr)_2(DPM)_2$ is used as the raw material of Ti.

Figure 1E:
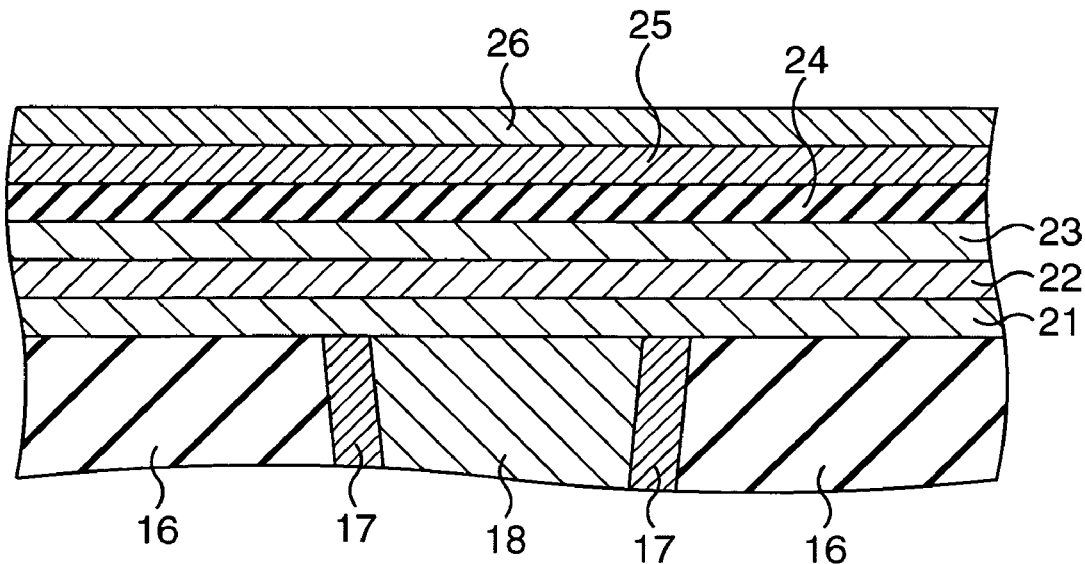

Next, as shown in FIG. 1E, an $IrO_X$ film 25 of a thickness of 50 nm is formed on the PZT film 24 as a first conductive noble metal film by a sputtering method, for example. The value of x is smaller than 2. Namely, an unsaturated iridium oxide film is formed. As the $IrO_X$ film 25, the crystallized one is formed. At this time, the set temperature of the silicon substrate 1 is made 300° C., Ar is supplied into the chamber at a flow rate of 140 sccm, and $O_2$ is supplied into the chamber at a flow rate of 60 sccm. The sputtering power is set at, for example, about 1 kW to 2 kW. Instead of the $IrO_X$ film 25, an oxide film of Ru, Rh, Re, Os or Pd may be formed. Alternatively, a stacked film of them may be formed.

Next, by performing RTA at 725° C. for 60 seconds while supplying $O_2$ at a flow rate of 20 sccm and supplying Ar at a flow rate of 2000 scm, into the chamber, the PZT film 24 is completely crystallized. By this RTA, the plasma damage of the $IrO_X$ film 25 is recovered, and oxygen deficiency in the PZT film 24 is compensated.

Thereafter, an $IrO_Y$ film 26 of a thickness of 50 nm to 100 nm is formed on the $IrO_X$ film 25 as a second conductive noble metal oxide film by a sputtering method, for example. When the atmosphere in the chamber is made a mixture atmosphere of Ar and $O_2$, the pressure in the chamber is set at 0.8 Pa, and the sputtering power is set at 1.0 kW, the thickness of the $IrO_Y$ film 26 becomes about 50 nm for about 20 seconds. The composition of $IrO_Y$ is made a composition closer to the stoichiometric composition of $IrO_2$ than the composition of $IrO_X$ (X<Y≦2). This is because by adopting such a composition, the catalytic activity to hydrogen is suppressed, the problem of the PZT film 24 being reduced by hydrogen radicals is suppressed, and hydrogen endurance of the ferroelectric capacitor is enhanced. Instead of the $IrO_Y$ film 26, an oxide film of Ru, Rh, Re, Os or Pd may be formed. What is made by stacking them may be used. The first conductive noble metal oxide film and the second conductive noble metal oxide film may differ in substances composing them.

Figure 5:
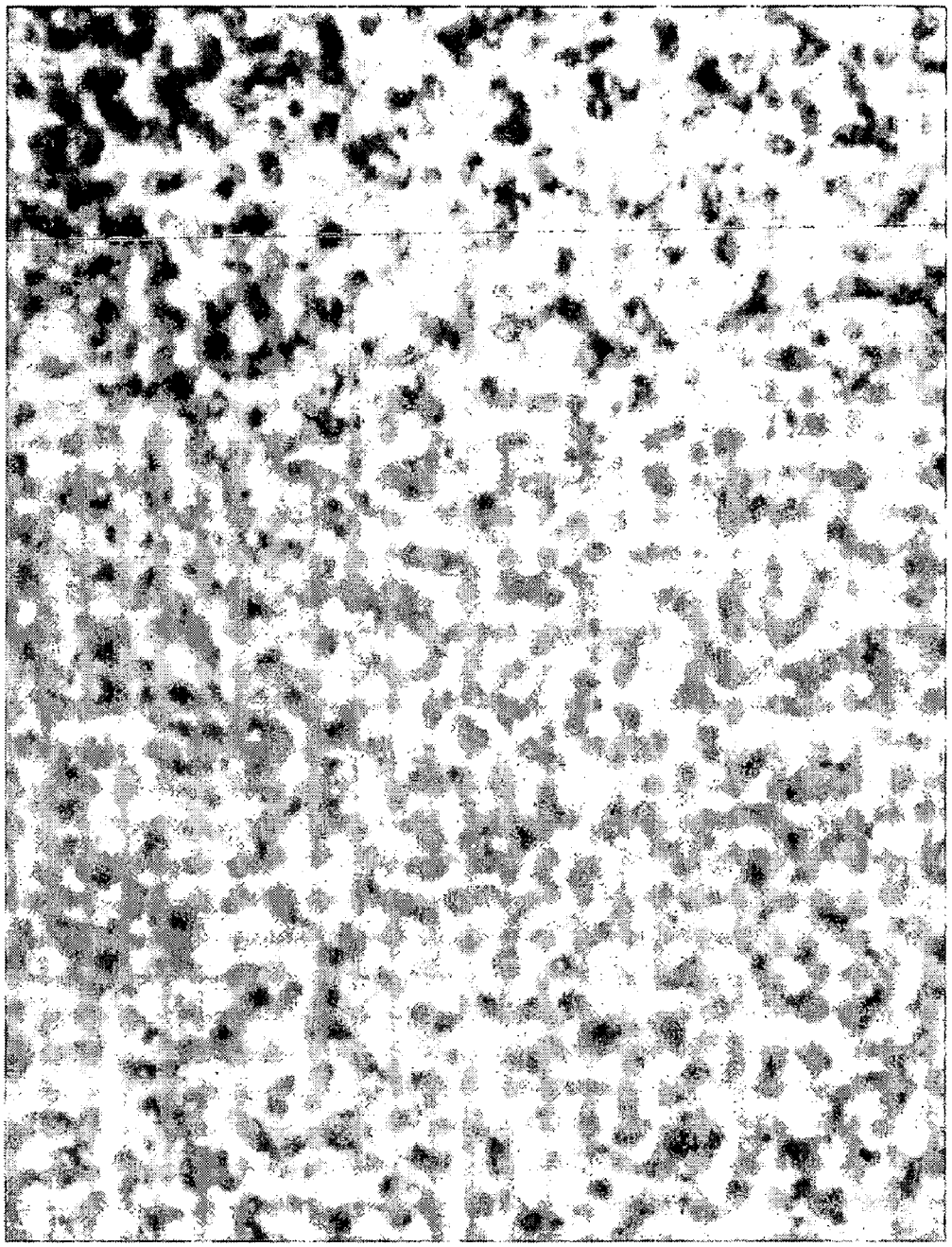
FIG. 5 is a microphotograph showing abnormal growth of the conductive oxide film.

The thickness of the $IrO_Y$ film 26 is preferably 100 nm or smaller. This is because when the thickness of the $IrO_Y$ film 26 exceeds 100 nm, there is a possibility of occurrence of abnormal oxidation as shown in FIG. 5 at the time of its formation.

Figure 6:
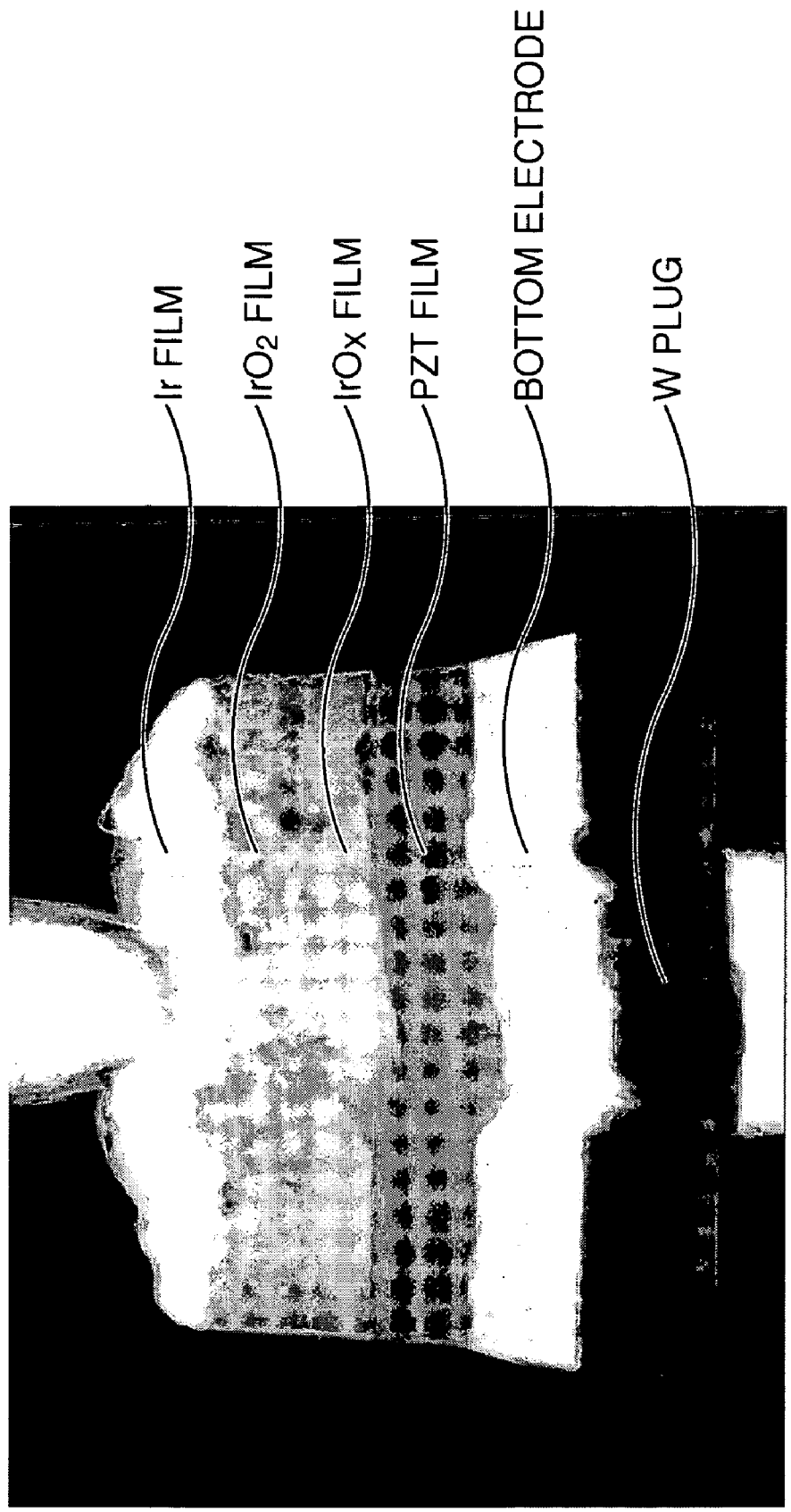
FIG. 6 is a microphotograph showing voids in the conductive oxide film.

After formation of the $IrO_Y$ film 26, RTA at 700° C. for 60 seconds is performed while $O_2$ is supplied at a flow rate of 20 sccm and Ar is supplied at a flow rate of 2000 scm, into the chamber, whereby the $IrO_Y$ film 26 is completely crystallized, and adhesion between the $IrO_X$ film 25 and the $IrO_Y$ film 26 is enhanced. By this RTA, the structure of the crystal composing the $IrO_Y$ film 26 becomes a face-centered cubic structure belonging to the tetragonal system. The shape of the crystal becomes a chill crystal or a columnar crystal. The property of the $IrO_Y$ film 26 becomes stable. In this embodiment, the $IrO_Y$ film 26 is formed in the amorphous state, and by performing heat treatment under the atmosphere containing oxygen immediately thereafter, $IrO_Y$ film 26 is crystallized. Therefore, oxygen deficiency is partially compensated, and voids as shown in FIG. 6 hardly occur.

Figure 1F:
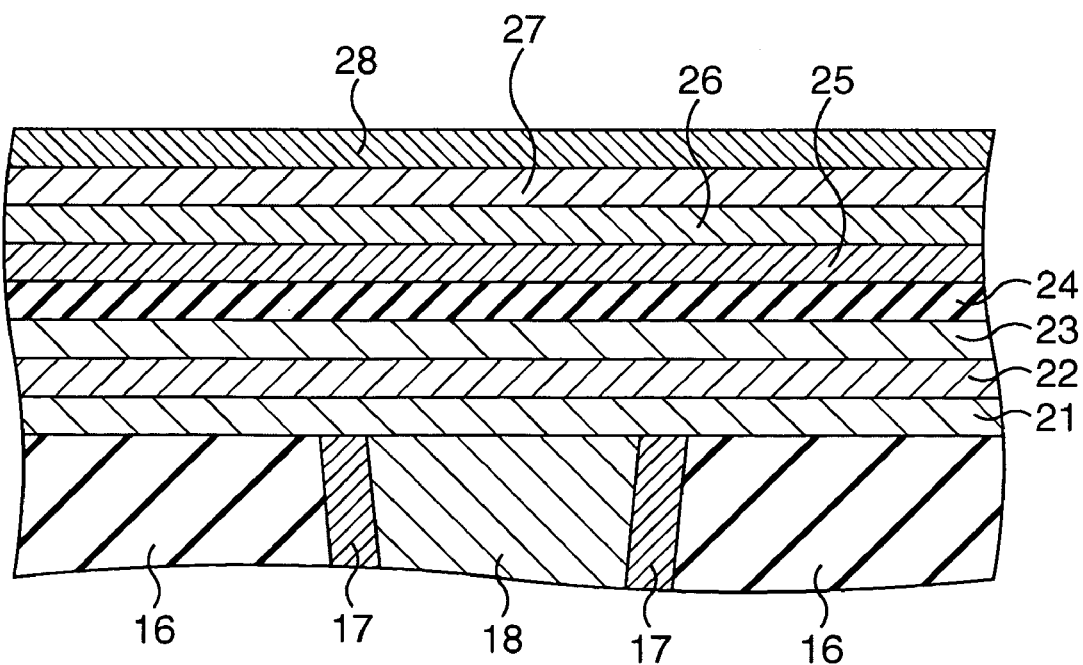

Next, as shown in FIG. 1F, an $Sr_XRu_YO_3$ film (SRO film) 27 in an amorphous state of a thickness of about 20 nm is formed as a conductive metal compound film on the $IrO_Y$ film 26 by a sputtering method, for example. At this time, the temperature of the silicon substrate 1 is set at a room temperature, Ar is supplied into the chamber at a flow rate of 100 sccm, and $O_2$ is supplied at a flow rate of 10 sccm. The sputtering power is set at, for example, 1 kW.

Thereafter, by performing annealing at 500° C. to 700° C. (for example, about 650° C.) in a mixture atmosphere of an inert gas such as $N_2$ or Ar and $O_2$, or in a rare gas atmosphere, the SRO film 27 is crystallized. Further, oxygen annealing for five hours is performed for the SRO film 27 at about 400° C. The oxygen annealing is performed in a non-reducing atmosphere of $N_2$, Ar or the like or in an oxidizing atmosphere. It is especially preferable to perform oxygen annealing in the atmosphere containing an $O_2$ gas. On performing the oxygen annealing, care should be taken not to contain a reducing gas such as $H_2$.

Next, an Ir film 28 (metal film) of a thickness of 50 nm to 100 nm is formed on the SRO film 27 by a sputtering method, for example, for the purpose of suppressing diffusion of hydrogen, enhancing conductivity and suppressing in-process degradation. At this time, the atmosphere in the chamber is made an Ar atmosphere (Ar flow rate: 100 sccm to 200 sccm) the pressure in the chamber is set at 1 Pa, and the sputtering power is set at 1.0 kW. The set temperature of the silicon substrate 1 on the occasion of forming the Ir film 28 is not especially limited, but in order to reduce the residual stress in the Ir film 28, it is preferably set at 350° C. to 450° C. Since the SRO film 27 is easily reduced, formation of the SRO film 27, oxidation annealing thereafter and formation of the Ir film 28 are preferably carried out continuously in a vacuum. Further, after forming the Ir film 28, it is preferable to perform annealing at 500° C. to 700° C. (for example, about 650° C.) in the mixture atmosphere of an inert gas such as $N_2$ or Ar and $O_2$, or a rare gas atmosphere. Instead of the Ir film 28, a noble metal film such as a Pt film, a Ru film, a Rh film or a Pd film may be formed. An alloy film such as a TiNi film, a TiAl film, a TaAl film or the like may be formed.

Figure 1G:
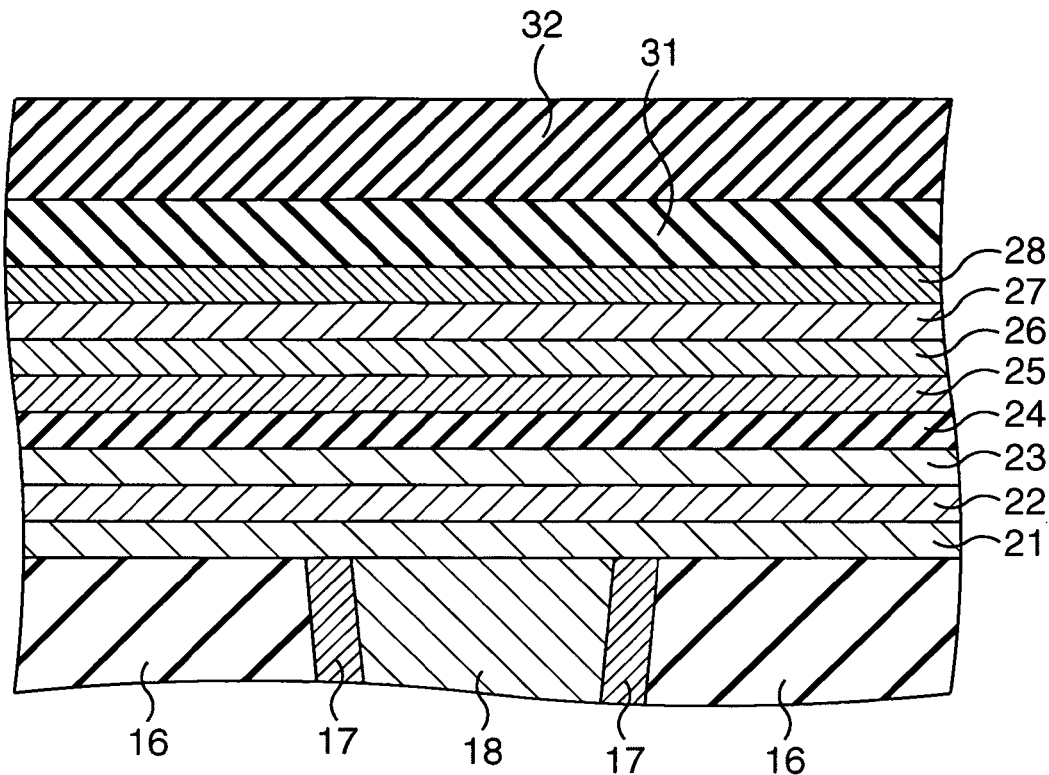

Thereafter, back surface cleaning is performed. Subsequently, as shown in FIG. 1G, a titanium nitride film (TiN film) 31 and a silicon oxide film 32 are sequentially formed on the Ir film 28. The TiN film 31 is formed by a sputtering method, for example. The silicon oxide film 32 is formed by a CVD method using a TEOS gas, for example.

Figure 1H:
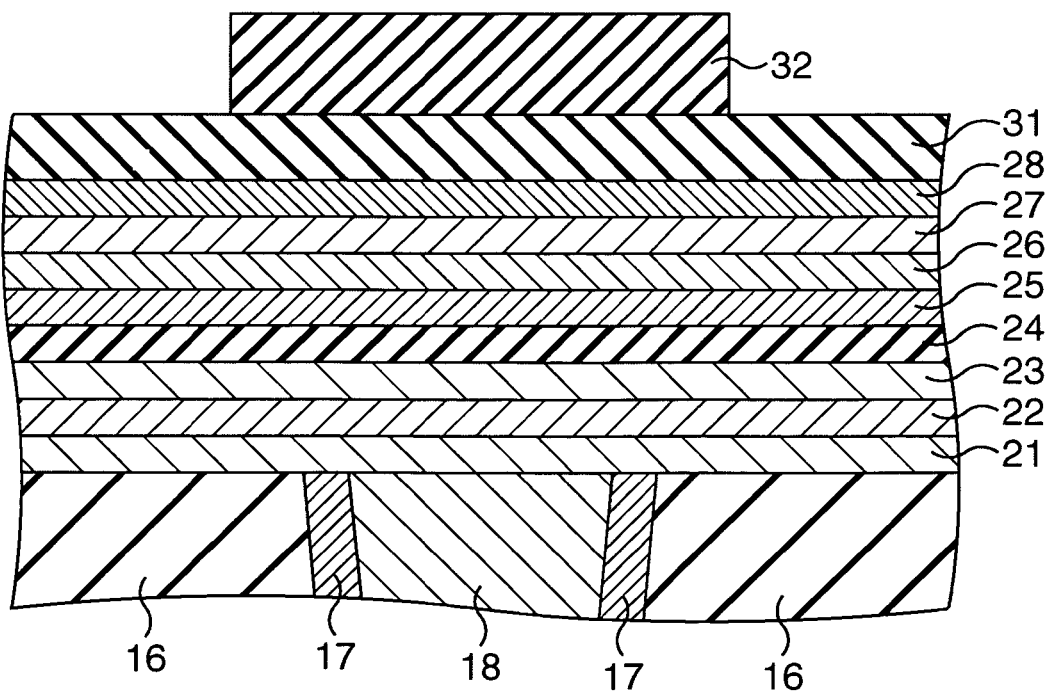

Next, as shown in FIG. 1H, the silicon oxide film 32 is patterned into an island shape.

Figure 1I:
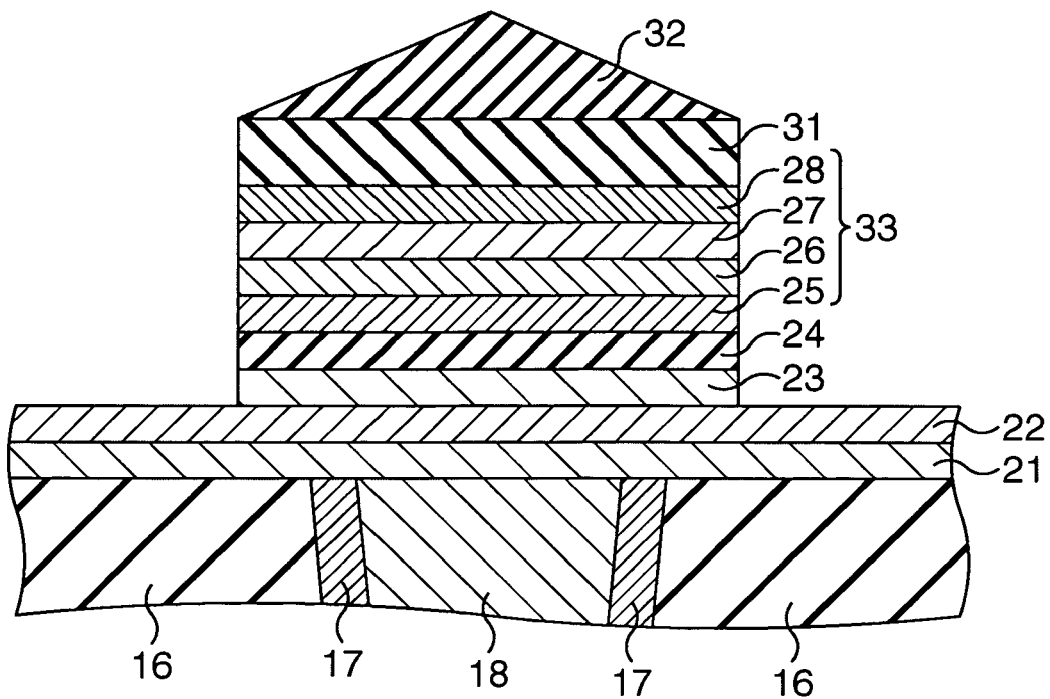

Next, as shown in FIG. 1I, the TiN film 31 is etched by using the silicon oxide film 32 as a mask. As a result, a hard mask composed of the island-shaped TiN film 31 and the silicon oxide film 32 is formed.

Next, by using the TiN film 31 and the silicon oxide film 32 as a mask, plasma etching using a mixture gas of HBr, $O_2$, Ar and $C_4F_8$ as an etching gas is performed for the Ir film 28, the SRO film 27, the $IrO_Y$ film 26, the $IrO_X$ film 25, the PZT film 24 and the Ir film 23. As a result, a top electrode 33 is formed.

Figure 1J:
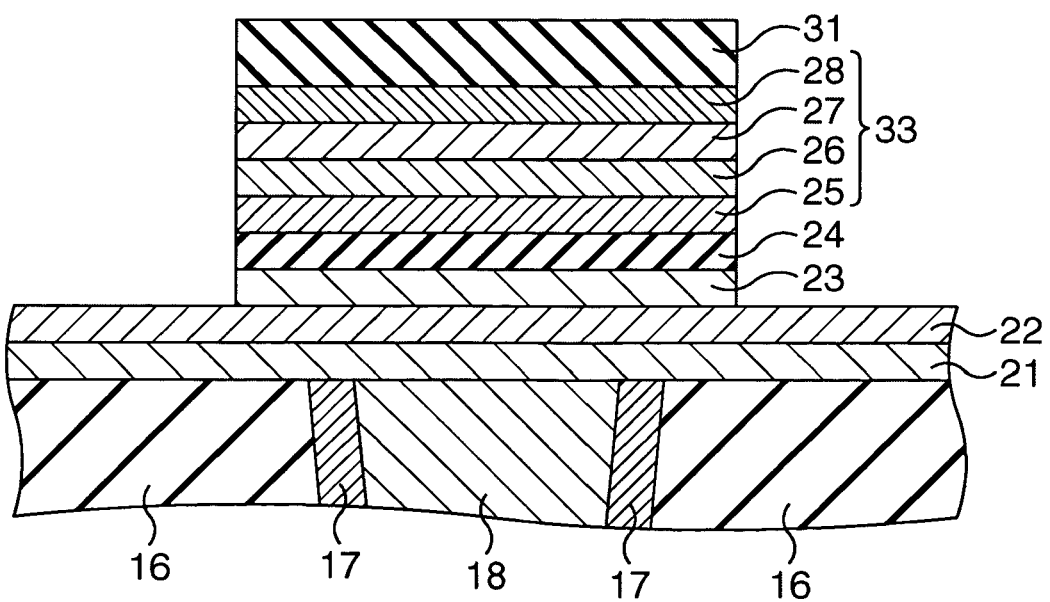

Subsequently, as shown in FIG. 1J, the silicon oxide film 32 is removed by dry etching or wet etching.

Figure 1K:
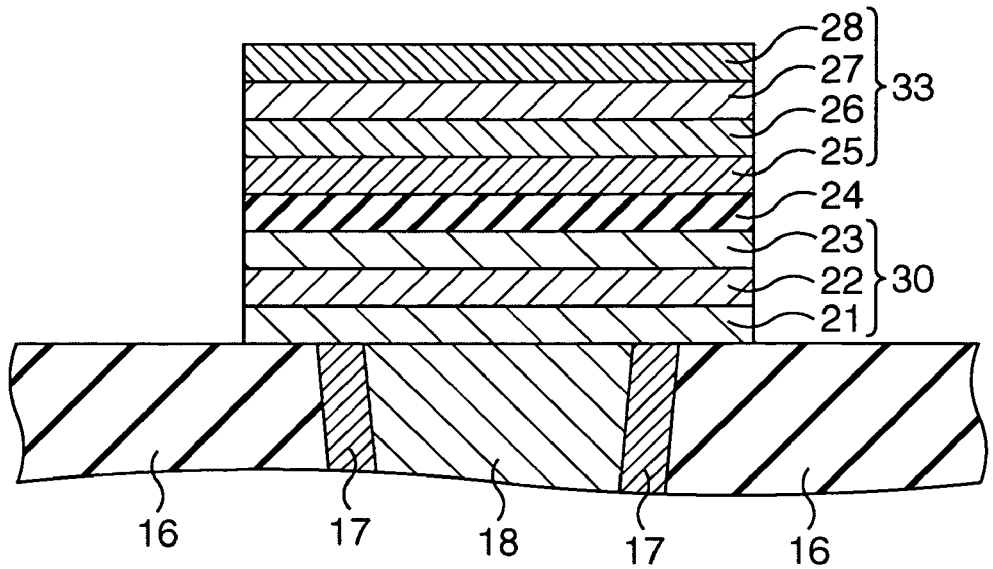

Next, as shown in FIG. 1K, by performing dry etching by using the Ir film 28 and the like as a mask, the TiAlN film 22 and the TiN film 21 are patterned. In this embodiment, a bottom electrode 30 is composed of the Ir film 23, the TiAlN film 22 and the TiN film 21. However, only the Ir film 23 can be regarded as the bottom electrode. The bottom electrode 30 may include a conductive film (including an oxide conductive film) containing Pt, Ir, Ru, Rh, Re, Os and/or Pd.

Figure 1L:
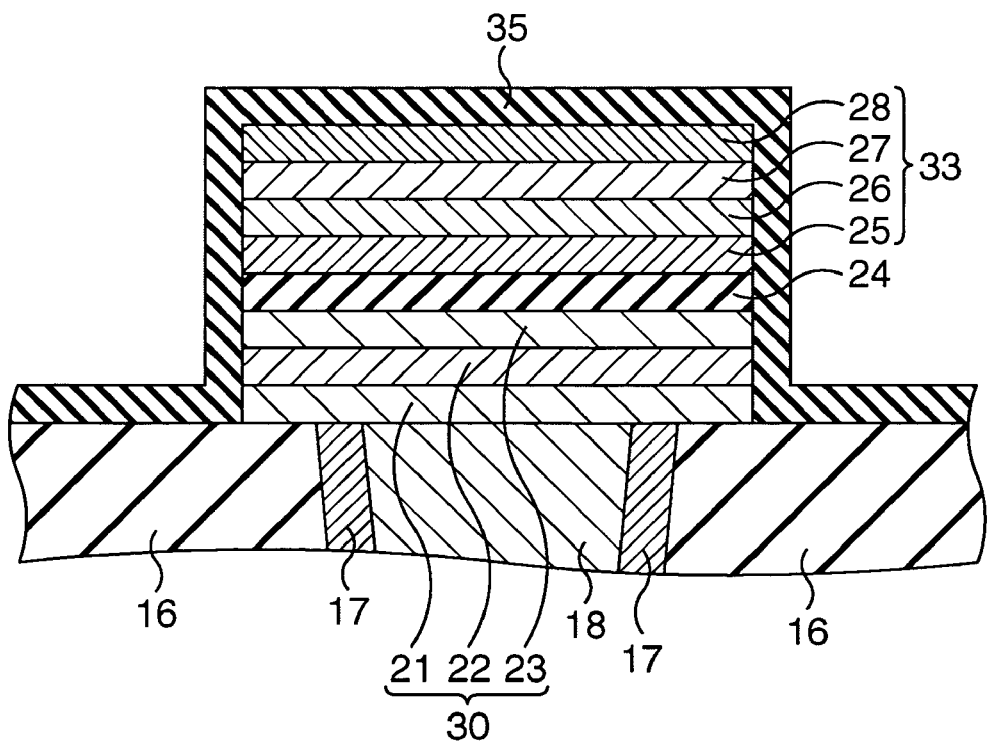

Next, as shown in FIG. 1L, a protection film 35 which covers a ferroelectric capacitor is formed on the silicon oxide film 16. As the protection film 35, an aluminum oxide film of a thickness of about 20 nm is formed by a sputtering method, for example.

Figure 1M:
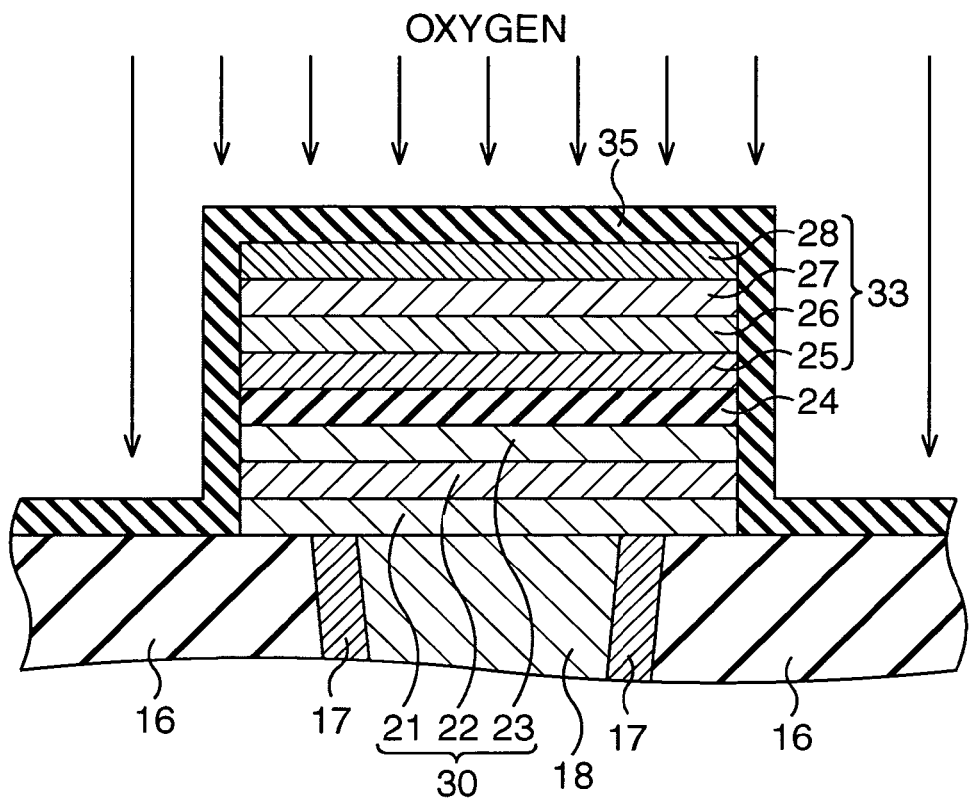

Thereafter, as shown in FIG. 1M, in order to recover the damage of the dielectric film capacitor, recovery annealing is performed under an oxygen containing atmosphere. The conditions of the recovery annealing are not especially limited, and for example, the set temperature of the silicon substrate 1 is set at 550° C. to 700° C., for example. Especially when the PZT film 24 is formed as the ferroelectric film as in this embodiment, recovery annealing at 650° C. for 60 minutes is performed under an oxygen atmosphere, for example.

Figure 1N:
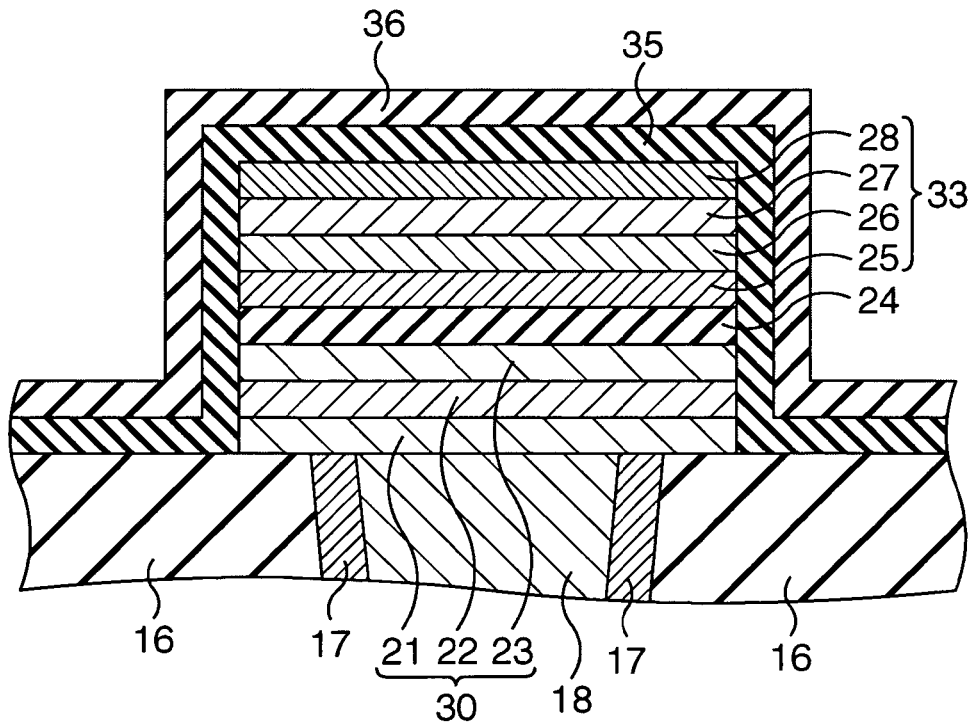

Thereafter, as shown in FIG. 1N, another new protection film 36 is formed on the protection film 35. As the protection film 36, an aluminum oxide film of a thickness of about 20 nm is formed by a CVD method, for example.

Figure 1O:
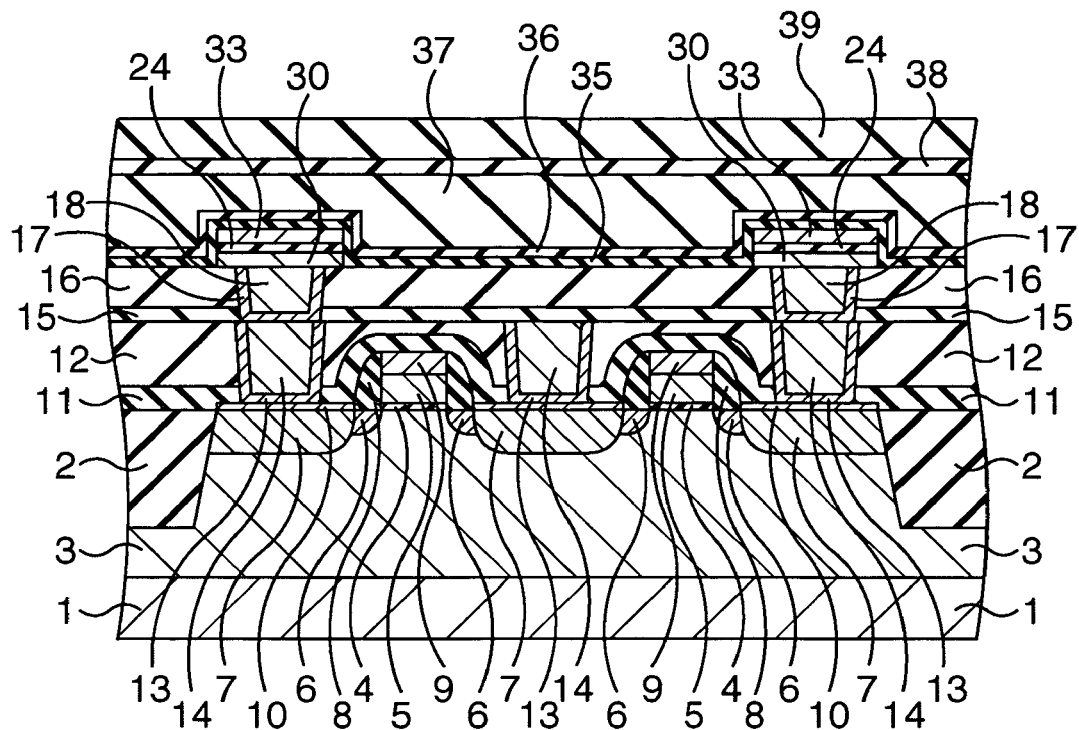

Next, as shown in FIG. 1O, a silicon oxide film 37 of a thickness of about 1500 nm is formed on the protection film 36 as an interlayer insulating film by a plasma TEOSCVD method, for example. At this time, as the source gas, for example, a mixture gas composed of a TEOS gas, an oxygen gas and a helium gas is used. Thereafter, the surface of the silicon oxide film 37 is flattened by a CMP method, for example. As the interlayer insulating film, for example, an inorganic film or the like having insulation properties may be formed.

Subsequently, under a plasma atmosphere which is generated by using, an $N_2O$ gas, an $N_2$ gas or the like, heat treatment is performed. As a result, moisture in the silicon oxide film 37 is removed, and the film quality of the silicon oxide film 37 is changed, whereby it becomes difficult for water to enter the silicon oxide film 37.

Thereafter, a protection film (barrier film) 38 is formed on the silicon oxide film 37 by a sputtering method or a CVD method, for example. As the protection film 38, for example, an aluminum oxide film of a thickness of 20 nm to 100 nm is formed. Since the protection film 38 is formed on the flattened silicon oxide film 37, the protection film 38 also becomes flat.

Next, a silicon oxide film 39 of a thickness of 300 nm to 500 nm is formed on the protection film 38 as an interlayer insulating film by a plasma TEOSCVD method, for example. Thereafter, the surface of the silicon oxide film 39 is flattened by a CMP method, for example. As the interlayer insulating film, a silicon oxynitride film, a silicon nitride film or the like may be formed.

Figure 1P:
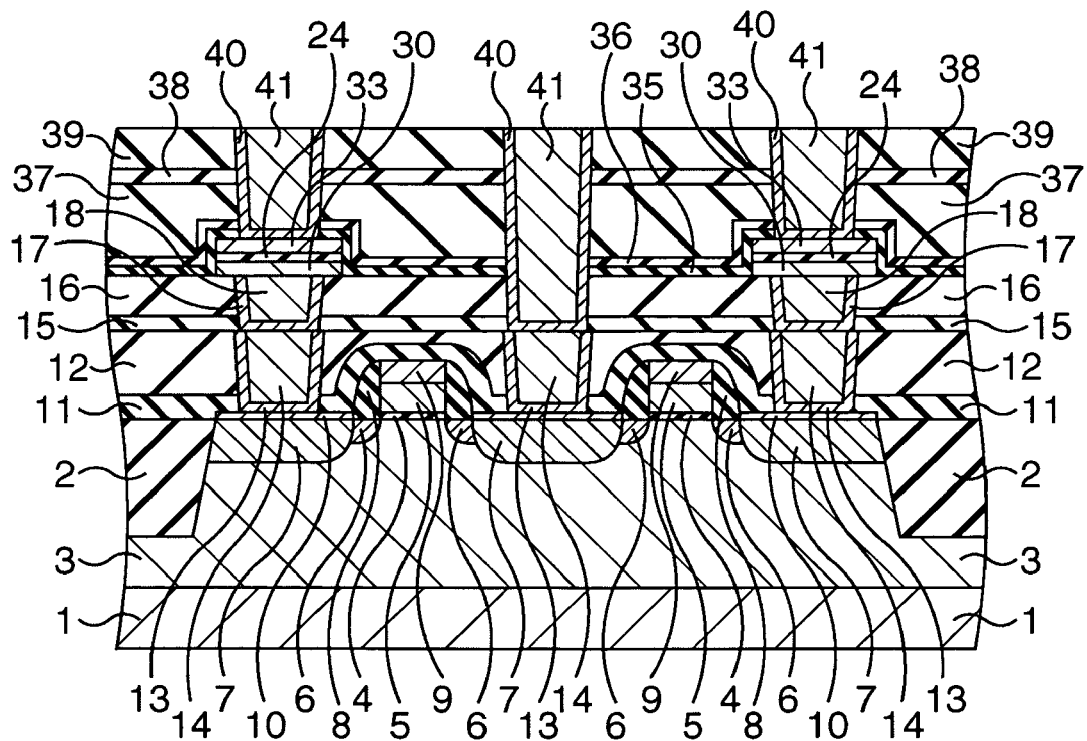
Figure 1Q:
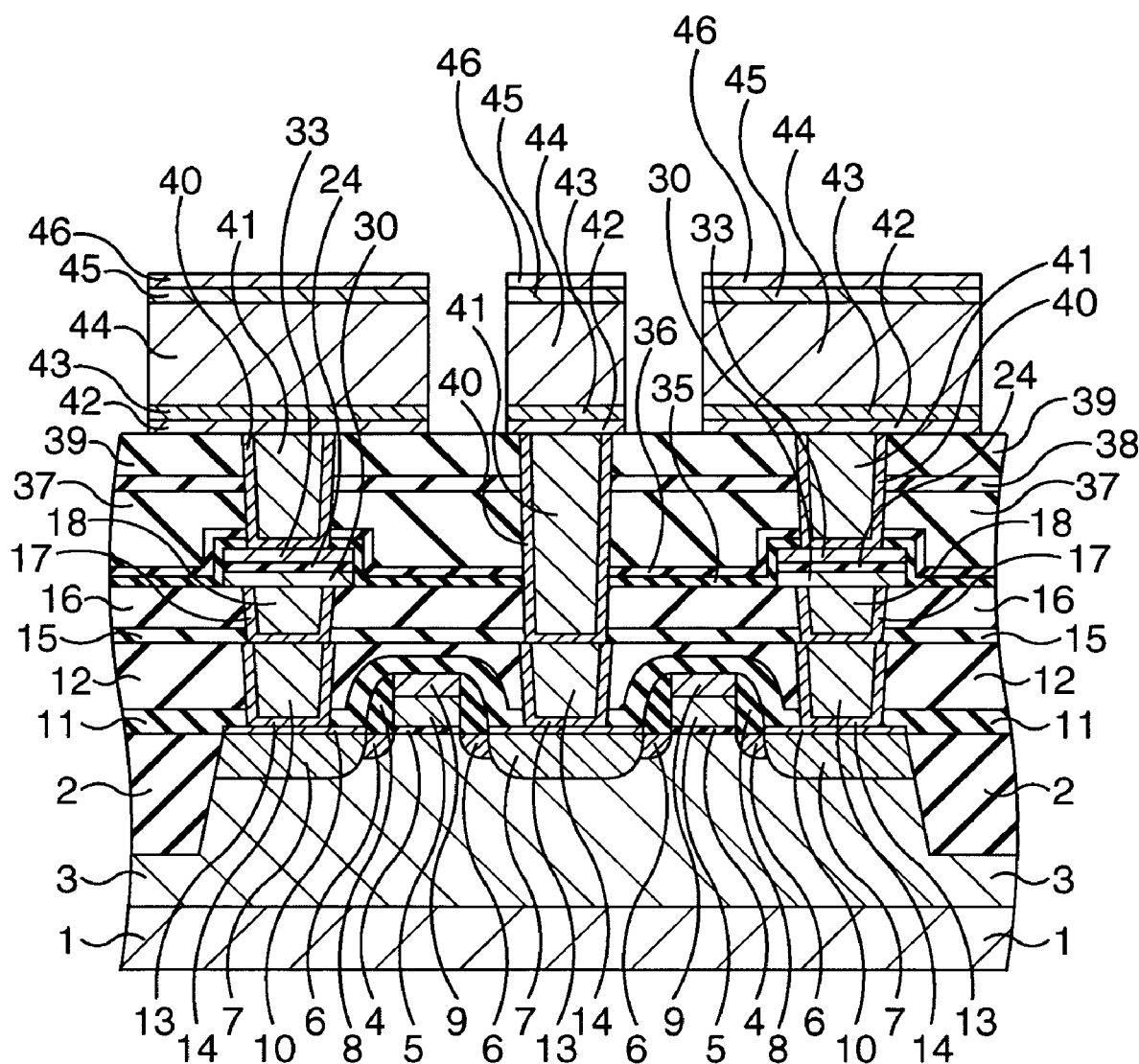

Next, as shown in FIG. 1P, by patterning the silicon oxide film 39, the protection film 38 and the silicon oxide film 37 by a photolithography technique, contact holes where the top electrodes 33 are exposed are formed. By patterning the silicon oxide film 39, the protection film 38, the silicon oxide film 37, the protection film 36, the protection film 35, the silicon oxide film 16 and the silicon oxynitride film 15 by a photolithography technique, contact holes where contact plugs composed of the glue films 13 and the W films 14 are exposed are formed. The diameter of the contact holes is, for example, 0.25 μm. Thereafter, by performing heat treatment under the oxygen atmosphere at 550° C., oxygen deficiency which occurs to the PZT film 24 at the time of formation of the contact holes is recovered.

Next, by sequentially forming a Ti film of a thickness of about 30 nm and a TiN film of a thickness of about 20 nm on the bottom portions and side portions of the contact holes, a glue film (adhesive film) 40 is formed. At this time, for example, the Ti film is formed by a sputtering method, and the TiN film is formed thereon by an MOCVD method. However, when the TiN film is formed by the MOCVD method, the treatment under plasma of a mixture gas of nitrogen and hydrogen is required for removing carbon from the TiN film. In this embodiment, the forefront surface of the top electrode 33 is the Ir film 28, and therefore, even if the plasma treatment is performed, the top electrode 33 is not reduced. As the glue film 40, only the TiN film may be formed.

Thereafter, a tungsten film (W film) 41 is formed in the contact holes and on the silicon oxide film 39. The thickness of the W film 41 is set at about 300 nm from the top surface of the silicon oxide film 39. Subsequently, by performing CMP, the glue film 40 and the W film 41 are left only in the contact holes. The contact plugs are composed of them. In this CMP, by performing over polishing, the glue film 40 and the W film 41 on the silicon oxide film 39 are completely removed.

Subsequently, as shown in FIG. 1Q, wirings composed of a Ti film 42, a TiN film 43, an AlCu film 44, a TiN film 45 and a Ti film 46 are formed on the silicon oxide film 39 and the contact plugs. On formation of the wirings, the Ti film of a thickness of 60 nm, the TiN film of a thickness of 30 nm, the AlCu film of a thickness of 360 nm, the Ti film of a thickness of 5 nm, and the TiN film of a thickness of 70 nm are sequentially formed by a sputtering method, for example, and these films are patterned by using a photolithography technique.

Thereafter, formation of an interlayer insulating film, formation of a contact plug, formation of wirings of the second layer and thereafter, and the like are further performed. Then, a cover film composed of, for example, a TEOS oxide film and a SiN film is formed to complete the ferroelectric memory having a ferroelectric capacitor.

In the first embodiment as above, the SRO film 27 is formed on the $IrO_Y$ film 26, and therefore, entry of hydrogen into the PZT film 24 can be suppressed without forming the $IrO_Y$ film 26 with a high oxidation degree to be so thick as to cause abnormal growth. This effect is not eliminated even when the noble metal film such as the Ir film 28 is formed on the SRO film 27. Accordingly, even if hydrogen is activated by catalysis at the time of formation of the silicon oxide film 37 or the like, the PZT film 24 is hardly reduced. Further, diffusion of hydrogen is suppressed by the SRO film 27, and therefore, occurrence of voids in the IrO$_Y$ film 26 is suppressed. Namely, the in-process degradation which conventionally occurs is suppressed. Therefore, high reliability can be obtained by securing excellent characteristics, for example, a switching charge amount.

The IrO$_X$ film 25 with a low oxidation degree is located on the lowermost layer of the top electrode 33, and therefore, the interface between the top electrode 33 and the PZT film 24 is favorable. Since the Ir film 28 is located on the uppermost layer of the top electrode 33, oxidation of the glue film 40, which is formed thereon, and rise in contact resistance with it do not occur.

The relation of "y'≈2−x'" is preferably established regarding the composition of the SRO film (Sr$_X$Ru$_Y$O$_3$ film) 27. The value of X' is preferably 0.9 to 1.1. This is for stably obtaining the effect of sufficiently suppressing diffusion of hydrogen. Further, the thickness of the SRO film 27 is preferably 5 nm to 100 nm. If the thickness of the SRO film 27 is less than 5 nm, there is a possibility that a sufficient effect cannot be obtained. On the other hand, when the thickness of the SRO film 27 exceeds 100 nm, it becomes difficult to work it and surface morphology (irregularities) easily occurs.

Instead of the SRO film 27, a LSCO(La$_{1-X}$Sr$_X$CoO$_3$) film, an YBCO(YBaCuO$_3$) film, a TiAlN film, a TaAlN film or the like may be formed as a conductive metal compound film including two kinds or more of metal elements. The crystal structure thereof preferably differs from that of the IrO$_Y$ film 26. This is for suppressing diffusion of hydrogen to suppress in-process degradation. For example, the one of, for example, a layer perovskite structure can be used.

The forming method of the conductive metal compound film is not limited to a sputtering method, and a sol-gel method, a chemical vapor deposition method (CVD) or the like may be used.

Second Embodiment

Figure 2A:
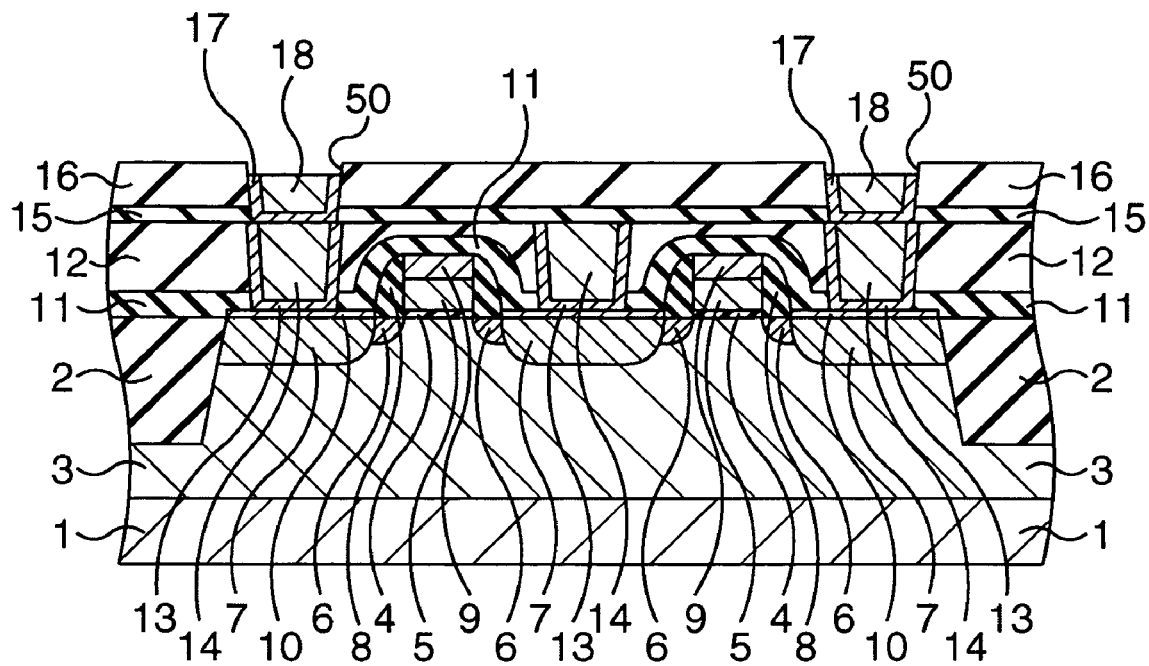
FIGS. 2A to 2C are sectional views showing a manufacturing method of a ferroelectric memory according to a second embodiment of the present invention in sequence of process steps.
Figure 2B:
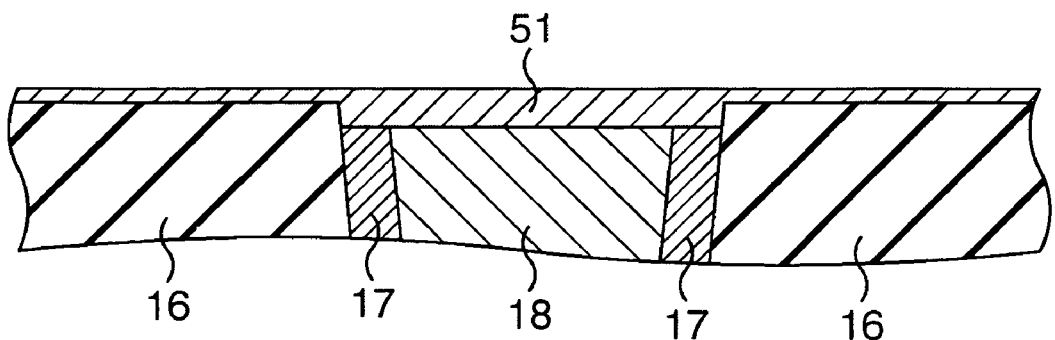
Figure 2C:
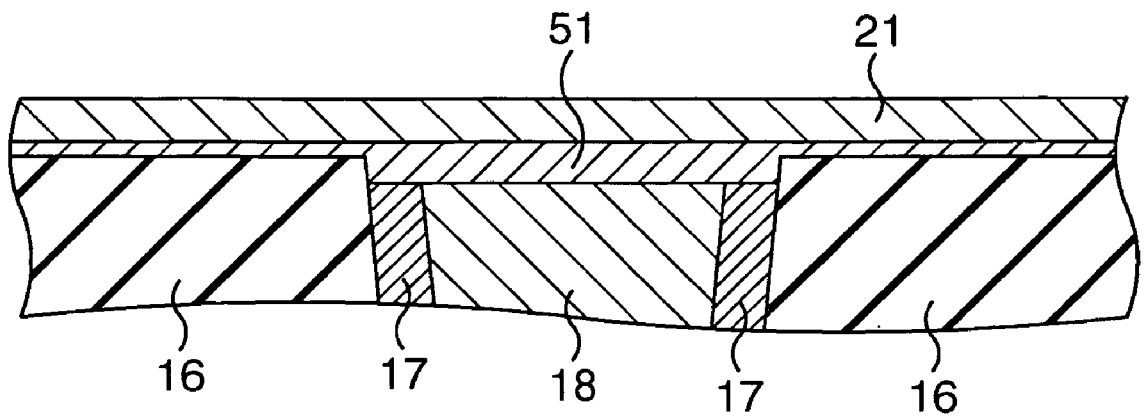

Next, a second embodiment of the present invention will be described. FIGS. 2A to 2C are sectional views showing a manufacturing method of a ferroelectric memory (semiconductor device) according to the second embodiment of the present invention in sequence of process steps.

In the second embodiment, the process up to the NH$_3$ plasma processing for the surface of the silicon oxide film 16 is performed first as in the first embodiment. However, on formation of the contact plugs composed of the glue film 17 and the W film 18, recesses are sometimes formed on the surfaces of the contact plugs as shown in FIG. 2A. The depth of the recess 50 is, for example, about 20 nm to 50 nm.

If the same processing as in the first embodiment is performed with such recesses 50 remaining, recessed portions reflecting the recesses 50 are formed on the surface of the TiN film 21 and the like, and orientation of the PZT film 24 degrades. Thus, in the second embodiment, as shown in FIG. 2B, a Ti film 51 of a thickness of about 100 nm is formed on the silicon oxide film 16 and the contact plugs. In the formation of the Ti film 51, for example, a sputtering apparatus with a target provided at the position separated by about 60 mm from the silicon substrate 1 is used. In the state in which the set temperature of the silicon substrate 1 is made 20° C., the pressure inside the chamber is set at 0.15 Pa, and the atmosphere in the chamber is made an Ar atmosphere, sputtering DC power at 2.6 kW is supplied for 35 seconds. Since in this embodiment, NH$_3$ plasma processing has been performed for the surface of the silicon oxide film 16 before formation of the Ti film 51, Ti atoms which are deposited thereon can freely move on the surface of the silicon oxide film 16 without being captured by oxygen atoms. As a result, the Ti film 51 is self-organized, and its surface is intensely oriented in the (002) plane.

Thereafter, the surface of the Ti film 51 is flattened by a CMP method, for example. The thickness of the Ti film 51 after being flattened is made, for example, 50 nm to 100 nm from the surface of the silicon oxide film 16. Control of the thickness is performed based on time control, for example.

Subsequently, the surface of the Ti film 51 is exposed to NH$_3$ plasma. Strain occurs to the crystal of the surface of the Ti film 51 due to flattening processing, and the plasma processing alleviates the strain. Therefore, degradation of the crystallinity of the film formed thereon can be prevented.

Next, a Ti film of a thickness of about 20 nm is formed on the Ti film 51. Next, as in the first embodiment, by performing RTA at 650° C. for 60 seconds under a nitrogen atmosphere, the Ti film is made the TiN film 21 with its surface intensely oriented in the (111) plane as shown in FIG. 2C.

Thereafter, processing of formation of the TiAlN film 22 and thereafter is performed as in the first embodiment.

According to the second embodiment as above, even if the recesses 50 are formed, a ferroelectric capacitor with favorable characteristics can be obtained.

Third Embodiment

Figure 3A:
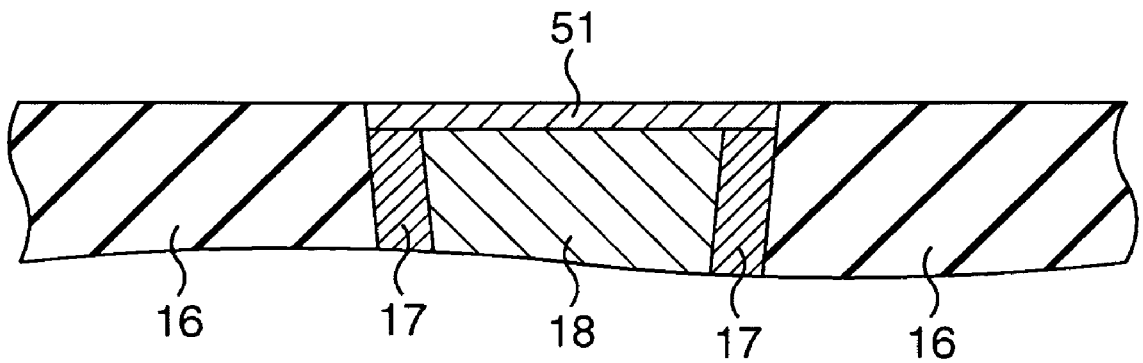
FIGS. 3A and 3B are sectional views showing a manufacturing method of a ferroelectric memory according to a third embodiment of the present invention in sequence of process steps.
Figure 3B:
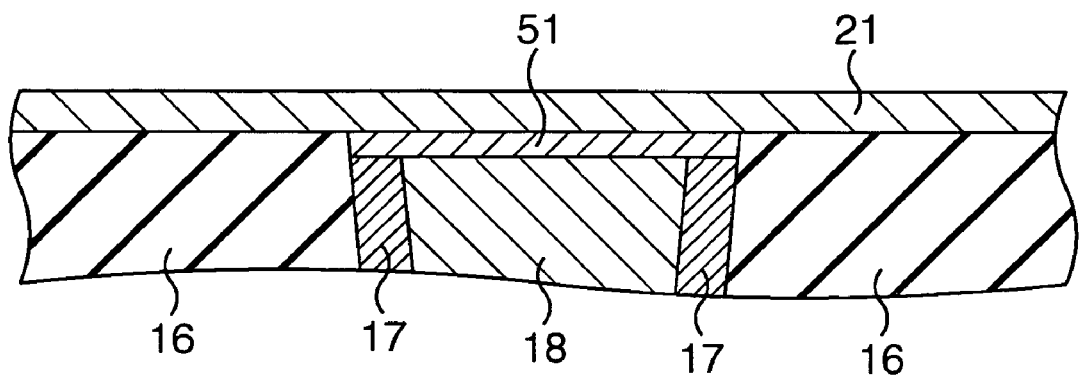

Next, a third embodiment of the present invention will be described. FIG. 3A and FIG. 3B are sectional views of a manufacturing method of a ferroelectric memory (semiconductor device) according to the third embodiment of the present invention in sequence of process steps.

In the third embodiment, the process up to the formation of the Ti film 51 is performed first as in the second embodiment. Thereafter, as shown in FIG. 3A, the surface of the Ti film 51 is flattened until the surface of the silicon oxide film 16 is exposed by a CMP method, for example. Namely, unlike the second embodiment, the Ti film 51 on the silicon oxide film 16 is completely removed.

Subsequently, as in the second embodiment, the surface of the Ti film 51 is exposed to the NH$_3$ plasma. Strain occurs to crystal on the surface of the Ti film 51 due to the fattening processing, but the plasma processing alleviates the strain. Therefore, degradation in crystallinity of the film formed thereon can be avoided before it occurs.

Next, a Ti film of a thickness of about 20 nm is formed on the Ti film 51. Next, as in the first and the second embodiments, by performing RTA at 650° C. under a nitrogen atmosphere for 60 seconds, the Ti film is made the TiN film 21 with its surface intensely oriented in the (111) plane as shown in FIG. 3B.

Thereafter, as in the first and the second embodiments, the process of formation of the TiAlN film 22 and thereafter is performed.

According to the third embodiment as above, the same effect as in the second embodiment is obtained.

Fourth Embodiment

Figure 4A:
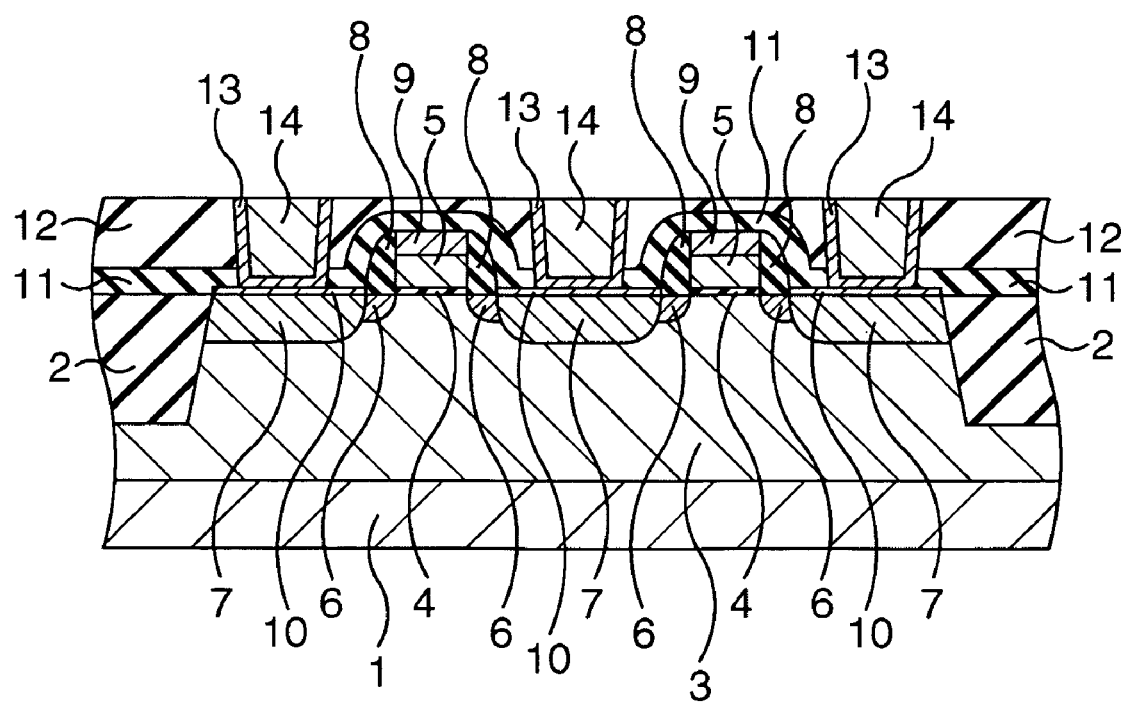
FIGS. 4A to 4C are sectional views showing a manufacturing method of a ferroelectric memory according to a fourth embodiment of the present invention in sequence of process steps.
Figure 4B:
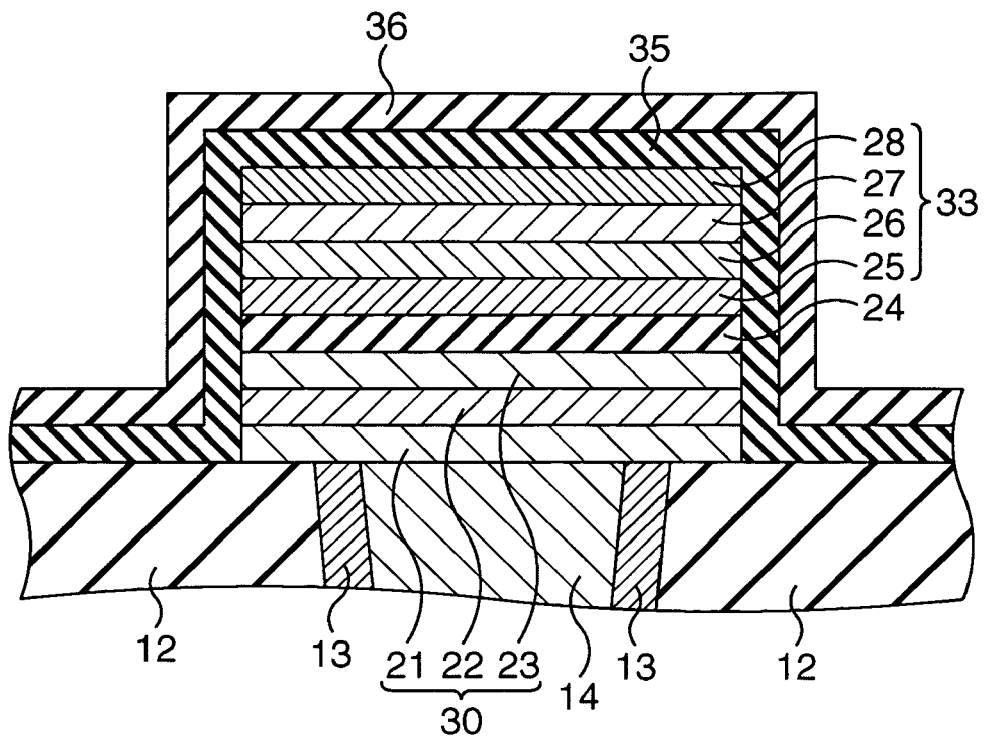
Figure 4C:
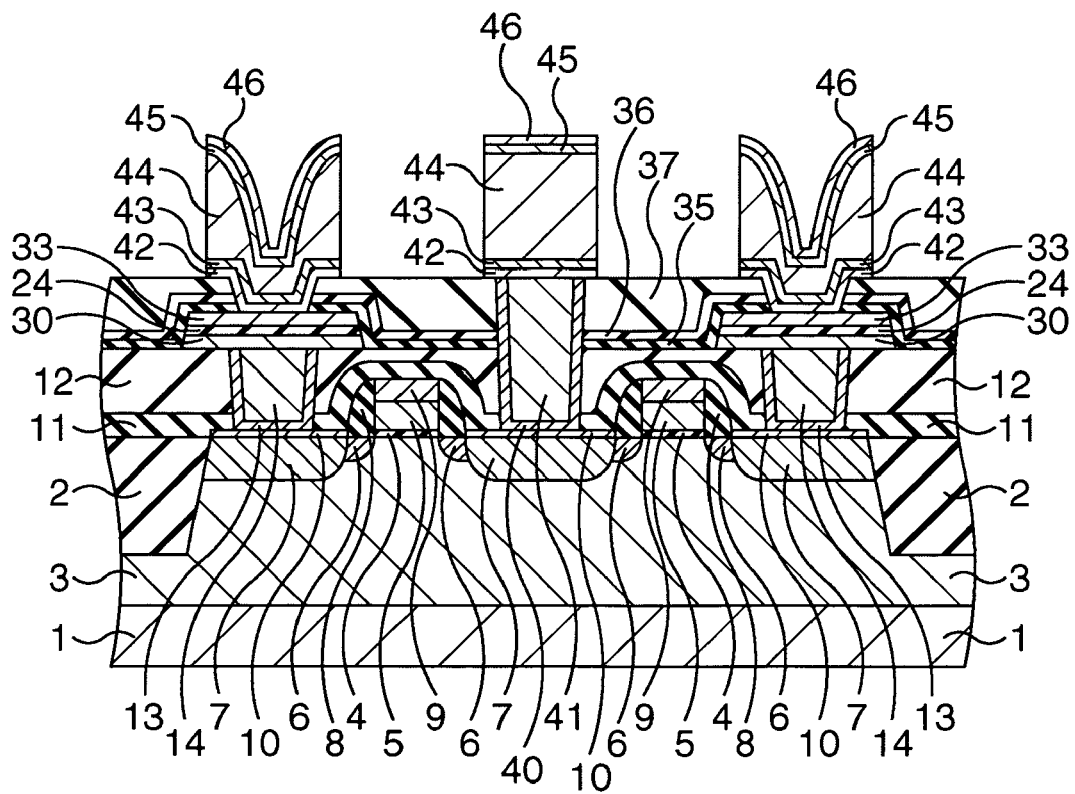

Next, a fourth embodiment of the present invention will be described. FIGS. 4A to 4C are sectional views showing a manufacturing method of a ferroelectric memory (semiconductor device) according to the fourth embodiment of the present invention in sequence of process steps.

In the fourth embodiment, the process up to the formation of the contact plugs composed of the glue film 13 and the W film 14 is performed first as in the first embodiment as shown in FIG. 4A.

Next, by performing $NH_3$ plasma processing for the surface of the silicon oxide film 12, NH groups are caused to bond to oxygen atoms on the surface of the silicon oxide film 12. In this plasma processing, for example, a parallel-plate type plasma processing apparatus in which opposed electrodes are provided at the position separated by about 9 mm (350 mils) from the silicon substrate 1 is used. Then, in the state in which the set temperature of the silicon substrate 1 is set at 400° C., and the pressure in the chamber is set at 266 Pa (2 Torr), an ammonia gas is supplied into the chamber at a flow rate of 350 sccm. A radiofrequency of 13.56 MHz is supplied to the silicon substrate 1 side with power of 100 W, and radiofrequency of 350 kHz is supplied to the opposed electrodes with power of 55 W. These are continued for 60 seconds.

Next, as shown in FIG. 4B, the TiN film 21 is formed on the silicon oxide film 12 and the contact plugs. The forming method of the TiN film 21 is the same as in the first embodiment. Thereafter, the process from the formation of the TiAlN film 22 to the formation of the protection film 36 is performed.

Thereafter, as shown in FIG. 4C, formation and flattening of the silicon oxide film 37 are performed similarly to the first embodiment. Next, a contact hole which reaches the silicide layer 10 shared by the two MOS transistors are formed in the silicon oxide film 37, the protection film 36, the protection film 35, the silicon oxide film 12 and the silicon oxynitride film 11. Then, in this contact hole, a contact plug composed of the glue film 40 and the W film 41 is formed. Further, with the contact plug covered with an oxidation preventing film (not shown) or the like, holes for exposing the top electrodes 33 are formed. Then, the oxidation preventing film is removed.

Subsequently, wiring and pads which are composed of a Ti film 42, a TiN film 43, an AlCu film 44, a TiN film 45 and a Ti film 46 are formed on the silicon oxide film 37, on the contact plug, and in the holes. On formation of the wiring and pads, a Ti film of a thickness of 60 nm, a TiN film of a thickness of 30 nm, an AlCu film of a thickness of 360 nm, a Ti film of a thickness of 5 nm and a TiN film of a thickness of 70 nm are formed in sequence by a sputtering method, for example, and these are patterned by using a photolithography technique.

Thereafter, formation of an interlayer insulating film, formation of a contact plug, formation of the wirings of the second layer and thereafter and the like are further performed. Then, a cover film composed of, for example, a TEOS oxide film and a SiN film is formed to complete a ferroelectric memory having a ferroelectric capacitor.

According to the fourth embodiment as above, the ferroelectric capacitor can be completed with the smaller number of process steps than in the first embodiment.

Figure 7A:
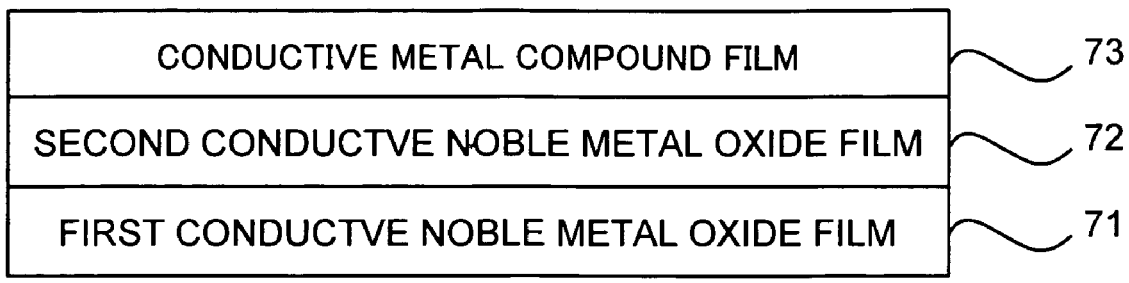
FIG. 7A is a schematic diagram showing a top electrode of a three-layer structure.
Figure 7B:
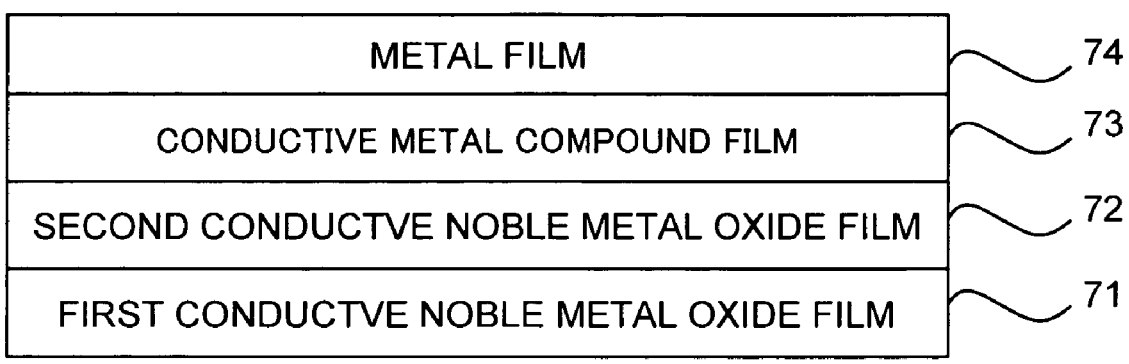
FIG. 7B is a schematic diagram showing a top electrode of a four-layer structure.
Figure 7C:
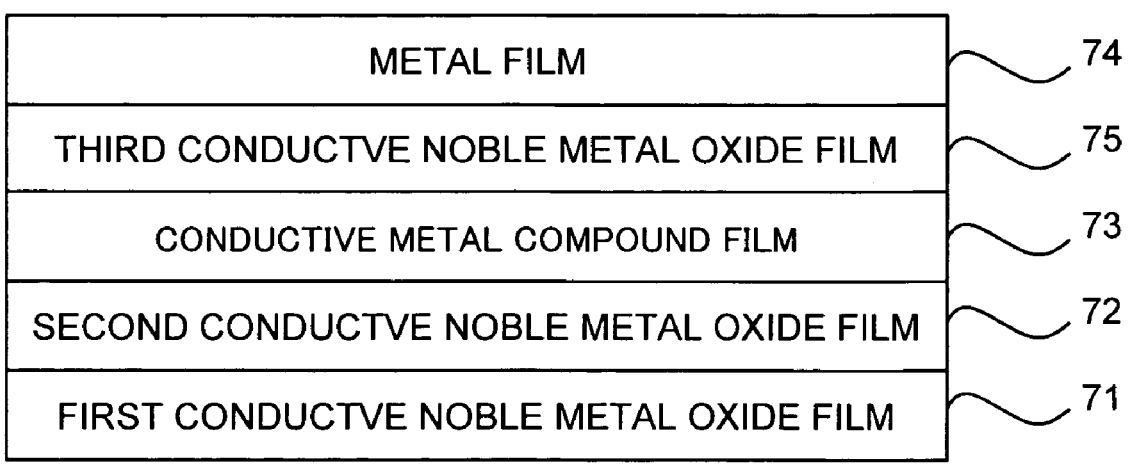
FIG. 7C is a schematic diagram showing a top electrode of a five layer structure.

In the first to the fourth embodiments, the Ir film 28 may be omitted. In this case, the top electrode has a three-layer structure composed of a first conductive noble metal oxide film 71, a second conductive noble metal oxide film 72 and a conductive metal compound film 73 as shown in FIG. 7A. When the metal film such as the Ir film 28 is provided, the top electrode has a four-layer structure composed of the first conductive noble metal oxide film 71, the second conductive noble metal oxide film 72, the conductive metal compound film 73 and the metal film 74 as shown in FIG. 7B.

It is preferable to form a third conductive noble metal oxide film of a thickness of, for example, 20 nm to 100 nm between the SRO film 27 and the Ir film 28. This is for suppressing the in-process degradation. In this case, the top electrode has a five-layer structure composed of the first conductive noble metal oxide film 71, the second conductive noble metal oxide film 72, the conductive metal compound film 73, a third conductive noble metal oxide film 75 and the metal film 74. As the third conductive noble metal film, an oxide film of, for example, Ir, Ru, Rh, Re, Os or Pd can be formed. The third conductive noble metal film may be formed under the same conditions as the second conductive noble metal oxide film, for example. When the third conductive noble metal film is formed, formation of the SRO film 27, oxidation annealing thereafter and formation of the third conductive noble metal oxide film are preferably carried out continuously in a vacuum.

The structure of the ferroelectric capacitor may be made a planer structure instead of a stack structure.

As the method for forming the ferroelectric film, a sputtering method, a sol-gel method, a metallo-organic decomposition (MOD) method, a CSD (Chemical Solution Deposition) method, a chemical vapor deposition (CVD) method, an epitaxial growth method, and the like are cited in addition to an MOCVD method. As the ferroelectric film, for example, a film of which crystal structure is a Bi-layer structure or a perovskite structure can be formed. As such a film, films expressed by general formulae of $ABO_3$ such as PZT doped with a very small amount of La, Ca, Sr, Si and/or the like, SBT, BLT and Bi-layer compounds can be cited in addition to a PZT film. When a ferroelectric film is formed by a sputtering method, the set temperature of the substrate is made 100° C. or lower, for example, and the ferroelectric film in an amorphous state is formed. Thereafter, by performing RTA under the mixture atmosphere of an inert gas and an oxygen gas, the ferroelectric film is crystallized. At this time, the oxygen content is preferably set at 10 vol % or less.

As the adhesive film, a Ti film, an Al oxide film, an Al nitride film, a TiAlN film, a Ta oxide film, a Ti oxide film, a Zr oxide film or the like may be used instead of the TiN film 21. However, in the case of using an insulating film, the structure of the ferroelectric capacitor is made a planar structure. As the oxygen barrier film, an Ir film, a Ru film or the like may be used instead of the TiAlN film 22. Instead of the Pt film 23, a Rh film, a Pd film, a Ru film or the like may be used. Instead of the $IrO_X$ film 24, a Rh oxide film, a Pd oxide film, a Ru oxide film or the like may be used. As the crystallinity improving film, instead of the Ti film 51, a Pt film, an Ir film, a Re film, a Ru film, a Pd film, an Os film or the like may be used, and oxide films of them may be used.

According to the present invention, the second conductive noble metal oxide film higher in oxidation degree than the first conductive noble metal oxide film, and the conductive metal compound film are used, and therefore, diffusion of hydrogen can be suppressed. Since the conductive metal compound film is formed on the second conductive noble metal oxide film, the second conductive noble metal oxide film does not have to be so thick as to cause abnormal oxidation. Accordingly, in-process degradation is suppressed, and high characteristics can be secured. As a result, high reliability can be obtained.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor device, comprising:
   a bottom electrode formed above a substrate;

a ferroelectric film formed on said bottom electrode; and
a top electrode formed on said ferroelectric film, said top electrode having:
a first conductive noble metal oxide film formed on said ferroelectric film;
a second conductive noble metal oxide film formed on said first conductive noble metal oxide film, said second conductive noble metal oxide film being higher in oxidation degree than said first conductive noble metal oxide film;
a conductive metal compound film formed on said second conductive noble metal oxide film;
a third conductive noble metal oxide film formed on said conductive metal compound film; and
a metal film formed on said third conductive noble metal oxide.

2. The semiconductor device according to claim 1, wherein a crystal structure of a substance composing said conductive metal compound film differs from a crystal structure of a substance composing said second conductive noble metal oxide film.

3. The semiconductor device according to claim 1, wherein said conductive metal compound film is one kind selected from a group consisting of a SrXRuYO3 film, a La1-XSrX-CoO3 film, an YBaCuO3, a TiAlN film and a TaAlN film.

4. The semiconductor device according to claim 1, wherein a thickness of said second conductive noble metal oxide film is 100 nm or less.

5. The semiconductor device according to claim 1, wherein said second conductive noble metal oxide film is an Ir (iridium) oxide film.

6. The semiconductor device according to claim 1, wherein said first conductive noble metal oxide film is an Ir (iridium) oxide film.

7. The semiconductor device according to claim 1, wherein said metal film is one kind selected from a group consisting of an Ir (iridium) film, a Pt (platinum) film, a Ru (ruthenium) film, a Rh (rhodium) film, a Pd (palladium) film, a TiNi (titanium/nickel) film, a TiAl (titanium aluminide) film and a TaAl (tantalum aluminide) film.

8. The semiconductor device according to claim 1, wherein said third conductive noble metal oxide film is composed of a same substance as said second conductive noble metal oxide film.

9. A method for manufacturing a semiconductor device, comprising:
forming a bottom electrode above a substrate;
forming a ferroelectric film on said bottom electrode; and
forming a top electrode on said ferroelectric film, the forming a top electrode comprising:
forming a first conductive noble metal oxide film on said ferroelectric film;
forming on said first conductive noble metal oxide film a second conductive noble metal oxide film higher in oxidation degree than said first conductive noble metal oxide film;
forming a conductive metal compound film on said second conductive noble metal film;
forming a third conductive noble metal oxide film on said conductive metal compound film; and
forming a metal film on said third conductive noble metal oxide film.

10. The method for manufacturing a semiconductor device according to claim 9, wherein, as a substance composing said conductive metal compound film, a substance of which crystal structure differs from a crystal structure of a substance which composes said second conductive noble metal oxide film is used.

11. The method for manufacturing a semiconductor device according to claim 9, wherein, as said conductive metal compound film, one kind selected from a group consisting of a SrXRuYO3 film, a La1-XSrXCoO3 film, an YBaCuO3 film, a TiAlN film and a TaAlN film is formed.

12. The method for manufacturing a semiconductor device according to claim 9, wherein a thickness of said second conductive noble metal oxide film is made 100 nm or less.

13. The method for manufacturing a semiconductor device according to claim 9, wherein an Ir (iridium) oxide film is formed as said second conductive noble metal oxide film.

14. The method for manufacturing a semiconductor device according to claim 9, wherein an Ir (iridium) oxide film is formed as said first conductive noble metal oxide film.

15. The method for manufacturing a semiconductor device according to claim 9, wherein, as said metal film, one kind selected from a group consisting of an Ir (iridium) film, a Pt (platinum) film, a Ru (ruthenium) film, a Rh (rhodium) film, a Pd (palladium) film, a TiNi (titanium/nickel) film, a TiAl (titanium aluminide) film and a TaAl (tantalum aluminide) film is formed.

16. The method for manufacturing a semiconductor device according to claim 9, wherein a film composed of a same substance as said second conductive noble metal oxide film is formed as said third conductive noble metal oxide film.

17. A semiconductor device, comprising:
a bottom electrode formed above a substrate;
a ferroelectric film formed on said bottom electrode; and
a top electrode formed on said ferroelectric film, said top electrode having:
a first conductive noble metal oxide film formed on said ferroelectric film;
a second conductive noble metal oxide film formed on said first conductive noble metal oxide film, said second conductive noble metal oxide film being higher in oxidation degree than said first conductive noble metal oxide film;
a conductive metal compound film formed on said second conductive noble metal oxide film; and
a metal film formed on said conductive metal compound film,
wherein said conductive metal compound film is one kind selected from a group consisting of a $Sr_xRu_yO_3$ film, a $La_{1-x}Sr_xCoO_3$ film, an $YBaCuO_3$ film, a TiAlN film and a TaAlN film.

18. A method for manufacturing a semiconductor device, comprising:
forming a bottom electrode above a substrate;
forming a ferroelectric film on said bottom electrode; and
forming a top electrode on said ferroelectric film, the forming a top electrode comprising:
forming a first conductive noble metal oxide film on said ferroelectric film;
forming on said first conductive noble metal oxide film a second conductive noble metal oxide film higher in oxidation degree than said first conductive noble metal oxide film;
forming a conductive metal compound film on said second conductive noble metal oxide film; and
forming a metal film on said conductive metal compound film,
wherein said conductive metal compound film is one kind selected from a group consisting of a $Sr_xRu_yO_3$ film, a $La_{1-x}Sr_xCoO_3$ film, an $YBaCuO_3$ film, a TiAlN film and a TaAlN film.

* * * * *